United States Patent
Yamaguchi et al.

(10) Patent No.: US 8,408,356 B2
(45) Date of Patent: Apr. 2, 2013

(54) STORAGE BOX FOR ELECTRONIC APPARATUS

(75) Inventors: Atsushi Yamaguchi, Kawasaki (JP);
Junichi Ishimine, Kawasaki (JP);
Masahiro Suzuki, Kawasaki (JP);
Tadashi Katsui, Kawasaki (JP);
Shin-ichirou Kouno, Kawasaki (JP);
Akira Takahashi, Fukushima (JP);
Akihiro Watanabe, Fukushima (JP);
Tomohiro Okazaki, Fukushima (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/081,498

(22) Filed: Apr. 16, 2008

(65) Prior Publication Data

US 2008/0257639 A1 Oct. 23, 2008

(30) Foreign Application Priority Data

| Apr. 17, 2007 | (JP) | 2007-108748 |
| Apr. 17, 2007 | (JP) | 2007-108749 |
| Apr. 17, 2007 | (JP) | 2007-108750 |
| Apr. 17, 2007 | (JP) | 2007-108751 |
| Apr. 17, 2007 | (JP) | 2007-108752 |

(51) Int. Cl.
*A47B 81/06* (2006.01)
*E04F 17/04* (2006.01)
*F02K 1/08* (2006.01)
*G10K 11/04* (2006.01)
*H05K 3/30* (2006.01)
*H05K 5/00* (2006.01)
*H05K 7/20* (2006.01)

(52) U.S. Cl. ........ 181/198; 181/199; 181/200; 181/216; 181/224; 29/832; 454/184; 361/695; 361/696

(58) Field of Classification Search .......... 181/198, 181/199, 200, 216, 224; 29/832; 361/695, 361/696; 454/184
See application file for complete search history.

(56) References Cited

U.S. PATENT DOCUMENTS 5,467,250 A * 11/1995 Howard et al. ............... 361/696
5,526,228 A * 6/1996 Dickson et al. .............. 361/695
(Continued)

FOREIGN PATENT DOCUMENTS

DE 8710688 11/1987
JP 53-009421 1/1978
(Continued)

OTHER PUBLICATIONS

Partial European Search Report, mailed by the European Patent Office on Dec. 4, 2009, in connection with corresponding patent application EP 08 10 3588.

(Continued)

*Primary Examiner* — David Warren
*Assistant Examiner* — Christina Russell
(74) *Attorney, Agent, or Firm* — Fujitsu Patent Center

(57) ABSTRACT

A box-shaped enclosure of a storage box includes a deadening wall or walls defining a storage space between first and second planes. The storage space is open at the first and second planes. A deadening wall member extends along the first plane. An auxiliary box-shaped enclosure is connected to the box-shaped enclosure so as to close the first plane of the box-shaped enclosure. The auxiliary box-shaped enclosure defines an auxiliary space isolated from the storage space with a deadening wall member. The storage space is connected to the fresh air through the ventilation opening and the auxiliary space. The deadening wall or walls of the box-shaped enclosure and the deadening wall member serve to prevent the leakage of the operating sound.

17 Claims, 20 Drawing Sheets

U.S. PATENT DOCUMENTS

| | | | | |
|---|---|---|---|---|
| 5,544,012 A * | 8/1996 | Koike | | 361/695 |
| 5,583,316 A | 12/1996 | Kitahara et al. | | |
| 5,636,286 A * | 6/1997 | Makabe et al. | | 381/71.5 |
| 5,756,931 A | 5/1998 | Kitahara et al. | | |
| 5,760,333 A | 6/1998 | Kitahara et al. | | |
| 6,011,216 A | 1/2000 | Kitahara et al. | | |
| 6,140,571 A | 10/2000 | Kitahara et al. | | |
| 6,143,977 A | 11/2000 | Kitahara et al. | | |
| 6,164,369 A * | 12/2000 | Stoller | | 165/104.33 |
| 6,166,904 A | 12/2000 | Kitahara et al. | | |
| 6,185,098 B1 * | 2/2001 | Benavides | | 361/695 |
| 6,506,111 B2 * | 1/2003 | Sharp et al. | | 454/184 |
| 6,632,995 B1 * | 10/2003 | Knieriem | | 174/50 |
| 6,776,706 B2 * | 8/2004 | Kipka et al. | | 454/184 |
| 6,819,563 B1 * | 11/2004 | Chu et al. | | 361/696 |
| 7,255,640 B2 * | 8/2007 | Aldag et al. | | 454/184 |
| 7,312,993 B2 * | 12/2007 | Bundza et al. | | 361/695 |
| 7,379,298 B2 * | 5/2008 | Walsh et al. | | 361/692 |
| 7,400,501 B2 * | 7/2008 | Bartell et al. | | 361/695 |
| 7,403,391 B2 * | 7/2008 | Germagian et al. | | 361/695 |
| 7,486,513 B2 * | 2/2009 | Hall et al. | | 361/699 |
| 7,492,593 B2 * | 2/2009 | Campbell et al. | | 361/696 |
| 7,522,418 B2 * | 4/2009 | Ishimine | | 361/699 |
| 7,707,711 B2 * | 5/2010 | Bartell et al. | | 29/832 |
| 7,712,576 B2 * | 5/2010 | Goto et al. | | 181/225 |
| 2004/0099747 A1 * | 5/2004 | Johnson et al. | | 236/49.3 |
| 2004/0100770 A1 * | 5/2004 | Chu et al. | | 361/698 |
| 2004/0132398 A1 * | 7/2004 | Sharp et al. | | 454/184 |
| 2006/0232945 A1 * | 10/2006 | Chu et al. | | 361/724 |
| 2008/0007791 A1 * | 1/2008 | Nagarajan et al. | | 361/687 |
| 2008/0007911 A1 * | 1/2008 | Hallin et al. | | 361/687 |

FOREIGN PATENT DOCUMENTS

| | | | |
|---|---|---|---|
| JP | 55-103988 U | | 7/1980 |
| JP | 57-017197 | | 1/1982 |
| JP | 57-17197 | | 1/1982 |
| JP | 57-181200 | | 11/1982 |
| JP | 58-138098 | | 8/1983 |
| JP | 1-276156 | | 11/1989 |
| JP | 4-85785 | | 7/1992 |
| JP | 5-18091 | | 3/1993 |
| JP | 5-38697 | | 5/1993 |
| JP | 06-334371 | | 12/1994 |
| JP | 7-7188 | | 1/1995 |
| JP | 7-30025 | | 1/1995 |
| JP | 11-66832 A | | 3/1999 |
| JP | 11-112175 | | 4/1999 |
| JP | 11-153894 | | 6/1999 |
| JP | 11-287544 | | 10/1999 |
| JP | 11-354964 | | 12/1999 |
| JP | 2002-196012 | | 7/2002 |
| JP | 2003-204183 A | | 7/2003 |
| JP | 2003204183 A | * | 7/2003 |
| JP | 2004-72057 A | | 3/2004 |
| JP | 2004072057 A | * | 3/2004 |
| JP | 2006228924 A | * | 8/2004 |
| JP | 2004-331185 | | 11/2004 |
| JP | 2005086081 A | * | 3/2005 |
| JP | 2006-507606 A | | 3/2006 |
| JP | 2006-127283 | | 5/2006 |
| JP | 2006156533 A | * | 6/2006 |
| JP | 2006-228924 | | 8/2006 |
| JP | 2006228924 A | * | 8/2006 |
| JP | 2007-65901 | | 3/2007 |
| WO | WO-2004/049773 | | 6/2004 |
| WO | WO-2006/068609 | | 6/2006 |
| WO | WO-2007/099542 | | 9/2007 |

OTHER PUBLICATIONS

Japan Patent Office; Office Action mailed Feb. 22, 2011, in connection with JP patent application No. 2007-108752, partial English language translation enclosed.

Japan Patent Office; Office Action mailed Feb. 8, 2011, in connection with JP patent application No. 2007-108751, partial English language translation enclosed.

Japan Patent Office (JPO), Office Action mailed May 24, 2011, in connection with correspondent JP application No. 2007-108748; English-language translation provided.

Japanese Office Action mailed Aug. 23, 2011 for corresponding Japanese Application No. 2007-108750, with English-language translation.

Japanese Office Action mailed Sep. 6, 2011 for corresponding Japanese Application No. 2007-108748, with English-language translation.

* cited by examiner

STORAGE BOX FOR ELECTRONIC APPARATUS

BACKGROUND OF THE INVENTION

1. Field of the Invention

The present invention relates to a storage box for an electronic apparatus such as a sever computer.

2. Description of the Prior Art

A rack-mount type server computer is well known. Semiconductor elements on a printed wiring board generate heat in the server computer, for example. Cooling fans are incorporated in the box-shaped enclosure of the server computer for cooling the semiconductor elements, for example.

A larger number of server computers are usually mounted on one rack. Such a group of server computers generates sound or noise during the operation. Accordingly, placement of the rack must be considered in view of noise from the server computers.

SUMMARY OF THE INVENTION

It is accordingly an object of the present invention to provide a storage box for an electronic apparatus significantly contributing to reduction in noise generated during the operation of the electronic apparatus.

According to a first aspect of the present invention, there is provided a storage box for an electronic apparatus, comprising: a box-shaped enclosure including a deadening wall or walls defining a storage space between first and second planes, the storage space being open at the first and second planes; a deadening wall member supported on the box-shaped enclosure, the deadening wall member extending along the first plane; an auxiliary box-shaped enclosure connected to the box-shaped enclosure so as to close the first plane of the box-shaped enclosure, the auxiliary box-shaped enclosure defining an auxiliary space isolated from the storage space with the deadening wall member; a through opening formed in the deadening wall member so as to spatially connect the storage space to the auxiliary space; and a ventilation opening formed on the auxiliary box-shaped enclosure at a position opposed to the deadening wall member.

The storage box allows an electronic apparatus or apparatuses to be enclosed in the box-shaped enclosure. The electronic apparatus or apparatuses are inserted into the storage space through the first or second plane. The first plane is closed with the auxiliary box-shaped enclosure. The storage space is connected to the fresh air through the ventilation opening, the auxiliary space and the through opening. The electronic apparatus or apparatuses generate operating sound or noise during the operation. The deadening wall or walls of the box-shaped enclosure and the deadening wall member serve to prevent the leakage of the operating sound. The operating sound also leaks out from the through opening at the first plane of the box-shaped enclosure into the auxiliary space. The operating sound then leaks out of the ventilation opening. Since the path of sound transmission is restricted, the leakage of the sound is reduced. Noise is thus reduced. In particular, the ventilation opening is opposed to the deadening wall member. In other words, the position of the ventilation opening is shifted from that of the through opening. The operating sound leaking through the through opening collides against the wall member of the auxiliary box-shaped enclosure. The transmission of the operating sound is in this manner effectively suppressed. Noise is reliably reduced. Moreover, the storage box allows establishment of a flow passage for airflow at the first plane of the box-shaped enclosure based on the through opening, the auxiliary space and the ventilation opening. The fresh air can reliably be introduced into the storage space. The electronic apparatus or apparatuses can thus effectively be cooled.

The auxiliary box-shaped enclosure may removably be coupled to the box-shaped enclosure. The auxiliary box-shaped enclosure can be removed in a facilitated manner. The maintenance of the electronic apparatus or apparatuses can be realized within the box-shaped enclosure in a facilitated manner. The auxiliary box-shaped enclosure can be replaced in a facilitated manner.

The deadening wall member and the deadening wall of the box-shaped enclosure may be made of a sound insulating material, for example. The sound insulating material is capable of blocking sound transmission. The leakage of the sound is thus prevented. An acoustic material may be attached to the inner surface of the box-shaped enclosure and the inner surface of the deadening wall member. The acoustic material is capable of absorbing sound. The leakage of the sound from the ventilation opening is thus reduced.

The storage box may further comprise: a second deadening wall member supported on the box-shaped enclosure, the second deadening wall member extending along the second plane; a second auxiliary box-shaped enclosure connected to the box-shaped enclosure so as to close the second plane, the second auxiliary box-shaped enclosure defining a second auxiliary space isolated from the storage space with the second deadening wall member; a second through opening formed in the second deadening wall member so as to spatially connect the storage space to the second auxiliary space; and a second ventilation opening formed on the second auxiliary box-shaped enclosure at a position opposed to the second deadening wall member. The second auxiliary box-shaped enclosure serves to close the second plane of the box-shaped enclosure. The storage space is connected to the fresh air not only through the aforementioned path based on the through opening, the auxiliary space and the ventilation opening but also through a path based on the second through opening, the second auxiliary space and the second ventilation opening. The deadening wall or walls of the box-shaped enclosure, the deadening wall member and the second deadening wall member serve to prevent the leakage of the operating sound during the operation of the electronic apparatus or apparatuses. The operating sound also leaks out from the ventilation opening at the first plane of the box-shaped enclosure as described above. Likewise, the operating sound leaks out from the second through opening at the second plane of the box-shaped enclosure into the second auxiliary space. The operating sound then leaks out of the second ventilation opening. Since the path of sound transmission is significantly restricted, the leakage of the sound is reduced. Noise is thus reduced with enhanced reliability. In particular, the second ventilation opening is opposed to the second deadening wall member. In other words, the position of the second ventilation opening is shifted from that of the second through opening. The operating sound leaking through the second through opening collides against the wall member of the second auxiliary box-shaped enclosure. The transmission of the operating sound is in this manner effectively suppressed. Noise is reliably reduced. Moreover, the storage box allows establishment of a flow passage for airflow at the first plane of the box-shaped enclosure based on the through opening, the auxiliary space and the ventilation opening. The storage box also allows establishment of a flow passage for airflow at the second plane of the box-shaped enclosure based on the second through opening, the second auxiliary space and the second ventilation opening. The fresh air can reliably be introduced into the storage space. The electronic apparatus or apparatuses can thus effectively be cooled.

The second auxiliary box-shaped enclosure may removably be coupled to the box-shaped enclosure. The second auxiliary box-shaped enclosure can be removed in a facilitated manner. The maintenance of the electronic apparatus or apparatuses can be realized within the box-shaped enclosure in a facilitated manner. The second auxiliary box-shaped enclosure can be replaced in a facilitated manner.

The second deadening wall member may be made of a sound insulating material in the same manner as the aforementioned deadening wall member and the deadening wall, for example. The sound insulating material is capable of blocking sound transmission. The leakage of the sound is thus prevented. In addition, an acoustic material may be attached to the inner surface of the second deadening wall member. The acoustic material is capable of absorbing sound. The leakage of the sound from the second ventilation opening is thus reduced.

According to a second aspect of the present invention, there is provided a storage box for an electronic apparatus, comprising: a box-shaped enclosure including a deadening wall or walls defining an inner space between first and second planes, the inner space being open at the first plane; a wall member defining a storage space and a flow passage in the box-shaped enclosure, the storage space being defined between the first plane and a third plane, the storage space being open at the first and third planes, the flow passage extending outside the storage space from the third plane of the storage space to the first plane; a first deadening wall member coupled to the box-shaped enclosure so as to close the storage space at the first plane; a second deadening wall member coupled to the box-shaped enclosure so as to close the flow passage at the first plane; a first through opening formed in the first deadening wall member; a second through opening formed in the second deadening wall member; a first auxiliary box-shaped enclosure connected to the first deadening wall member, the first auxiliary box-shaped enclosure defining a first ventilation opening at a position opposed to the first deadening wall member; and a second auxiliary box-shaped enclosure connected to the second deadening wall member, the second auxiliary box-shaped enclosure defining a second ventilation opening at a position opposed to the second deadening wall member.

The storage box allows an electronic apparatus or apparatuses to be enclosed in the box-shaped enclosure. The electronic apparatus or apparatuses are inserted into the storage space through the first plane. The first plane is closed with the first and second auxiliary box-shaped enclosures. The storage space is connected to the fresh air through a path including the first ventilation opening, the first auxiliary space and the first through opening and through a path including the second ventilation opening, the second auxiliary space, the second through opening and the flow passage. The electronic apparatus or apparatuses generate operating sound during the operation. The deadening wall or walls of the box-shaped enclosure and the first and second deadening wall members serve to prevent the leakage of the operating sound. The operating sound also leaks out through the first and second through openings at the first plane of the box-shaped enclosure into the first and second auxiliary spaces, respectively. The operating sound then leaks out of the first and second ventilation openings. Since the path of sound transmission is restricted, the leakage of the sound is reduced. Noise is thus reduced. In particular, the first and second ventilation openings are opposed to the first and second deadening wall members, respectively. In other words, the positions of the first and second ventilation openings are shifted from those of the first and second through openings, respectively. The operating sound leaking through the through opening collides against the wall members of the first and second auxiliary box-shaped enclosures. The transmission of the operating sound is in this manner effectively suppressed. Noise is reliably reduced. Moreover, the two paths for airflow are established within the storage box as described above. The introduced airflow can be separated from the discharging airflow. The fresh air can reliably be introduced into the storage space. The electronic apparatus or apparatuses can thus be effectively cooled. In addition, the first and second ventilation openings are collectively placed at the first plane. The storage box can thus flexibly be placed. Here, the deadening wall member may removably be attached to close the second plane. Alternatively, the deadening wall may be attached for relative swinging movement for opening and closing the second plane. The electronic apparatus or apparatuses may be inserted into or removed out of the storage box through the second plane.

The first and second deadening wall members and the first and second auxiliary box-shaped enclosures may removably be coupled to the box-shaped enclosure. The first and second deadening wall members and the first and second auxiliary box-shaped enclosures can be removed in a facilitated manner. The maintenance of the electronic apparatus or apparatuses can be realized within the box-shaped enclosure in a facilitated manner. The first and second deadening wall members and the first and second auxiliary box-shaped enclosures can be replaced in a facilitated manner.

The deadening wall or walls of the box-shaped enclosure and the first and second sound insulating members may be made of a sound insulating material, for example. The sound insulating material is capable of blocking sound transmission. The leakage of the sound is thus prevented. An acoustic material may be attached to the inner surface of the box-shaped enclosure and the inner surfaces of the first and second deadening wall members. The acoustic material is capable of absorbing sound. The leakage of the sound from the ventilation opening from the first and second ventilation openings is thus reduced.

According to a third aspect of the present invention, there is provided a storage box for an electronic apparatus, comprising: a box-shaped enclosure including a deadening wall or walls defining a storage space between first and second planes, the storage space being open at the first and second planes; a deadening wall member supported on the box-shaped enclosure, the deadening wall member extending along the first plane; an auxiliary box-shaped enclosure connected to the box-shaped enclosure so as to close the first plane of the box-shaped enclosure, the auxiliary box-shaped enclosure defining an auxiliary space isolated from the storage space with the deadening wall member; a through opening formed in the deadening wall member so as to spatially connect the storage space to the auxiliary space; and a ventilation opening formed on the auxiliary box-shaped enclosure at the position farthest from the through opening.

The storage box allows an electronic apparatus or apparatuses to be enclosed in the box-shaped enclosure. The storage space is open at the first and second planes. The electronic apparatus or apparatuses are inserted into the storage space through the first or second plane. The first plane is closed with the auxiliary box-shaped enclosure. The storage space is connected to the fresh air through the ventilation opening, the auxiliary space and the through opening. The electronic apparatus or apparatuses generate operating sound or noise during the operation. The deadening wall or walls of the box-shaped enclosure and the deadening wall member serve to prevent the leakage of the operating sound. The operating sound also leaks out from the through opening at the first plane of the box-shaped enclosure into the auxiliary space. The operating sound then leaks out of the ventilation opening. Since the path of sound transmission is restricted, the leakage of the sound is reduced. Noise is thus reduced. In particular, the ventilation opening is formed at the position farthest from the through opening. In other words, a distance is established between the ventilation opening and the through opening within the auxiliary space. The transmission of the operating sound is in this manner effectively suppressed. Noise is reliably reduced. Moreover, the storage box allows establishment of a flow passage for airflow at the first plane of the box-shaped enclosure based on the through opening, the auxiliary space and the ventilation opening. The fresh air can reliably be introduced into the storage space. The electronic apparatus or apparatuses can thus effectively be cooled.

The auxiliary box-shaped enclosure may removably be coupled to the box-shaped enclosure. The auxiliary box-shaped enclosure can be removed in a facilitated manner. The maintenance of the electronic apparatus or apparatuses can be realized within the box-shaped enclosure in a facilitated manner. The auxiliary box-shaped enclosure can be replaced in a facilitated manner.

The deadening wall or walls of the box-shaped enclosure and the deadening wall member may be made of a sound insulating material, for example. The sound insulating material is capable of blocking sound transmission. The leakage of the sound is thus prevented. An acoustic material may be attached to the inner surface of the box-shaped enclosure and the inner surface of the deadening wall member. The acoustic material is capable of absorbing sound. The leakage of the sound from the ventilation opening is thus reduced.

The storage box may further comprise: a second deadening wall member supported on the box-shaped enclosure, the second deadening wall member extending along the second plane; a second auxiliary box-shaped enclosure connected to the box-shaped enclosure so as to close the second plane, the second auxiliary box-shaped enclosure defining a second auxiliary space isolated from the storage space with the second deadening wall member; a second through opening formed in the second deadening wall member so as to spatially connect the storage space to the second auxiliary space; and a second ventilation opening formed on the second auxiliary box-shaped enclosure at the position farthest from the second through opening. The second plane of the box-shaped enclosure is closed with the second auxiliary box-shaped enclosure. The storage space is connected to the fresh air not only through the aforementioned path including the through opening, the auxiliary space and the ventilation opening but also through a path including the second through opening, the second auxiliary space and the second ventilation opening. The deadening wall or walls of the box-shaped enclosure, the deadening wall member and the second deadening wall member serve to prevent the leakage of the operating sound during the operation of the electronic apparatus or apparatuses. The operating sound also leaks out of the ventilation opening at the first plane of the box-shaped enclosure as described above. Likewise, the operating sound leaks out through the second through opening at the second plane of the box-shaped enclosure into the second auxiliary space. The operating sound then leaks out of the second ventilation opening. Since the path of the sound transmission is significantly restricted, the leakage of the sound is reduced. Noise is thus reduced with enhanced reliability. In particular, the second ventilation opening is formed at the farthest position from the second through opening. In other words, a distance is established between the second ventilation opening and the second through opening within the second auxiliary space. The transmission of the sound is in this manner effectively suppressed. Noise is reliably reduced. Moreover, the storage box allows establishment of a flow passage for airflow at the first plane of the box-shaped enclosure based on the through opening, the auxiliary space and the ventilation opening. The storage box also allows establishment of a flow passage for airflow at the second plane based on the second through opening, the second auxiliary space and the second ventilation opening. The fresh air can reliably be introduced into the storage space. The electronic apparatus or apparatuses can thus effectively be cooled.

The second auxiliary box-shaped enclosure may removably be coupled to the box-shaped enclosure. The second auxiliary box-shaped enclosure can be removed in a facilitated manner. The maintenance of the electronic apparatus or apparatuses can be realized within the box-shaped enclosure in a facilitated manner. The second auxiliary box-shaped enclosure can be replaced in a facilitated manner.

The second deadening wall member may be made of a sound insulating material in the same manner as the aforementioned deadening wall member and deadening wall, for example. The sound insulating material is capable of blocking sound transmission. The leakage of the sound is thus prevented. In addition, an acoustic material may be attached to the inner surface of the second deadening wall member. The acoustic material is capable of absorbing sound. The leakage of the sound from the second ventilation opening is thus reduced.

According to a fourth aspect of the present invention, there is provided a storage box for an electronic apparatus, comprising: a box-shaped enclosure including a deadening wall or walls defining an inner space between first and second planes, the inner space being open at the first and second planes; a wall member defining a storage space and a flow passage in the box-shaped enclosure, the storage space being defined between the first plane and a third plane, the storage space being open at the first and third planes, the storage space being open at the first and third planes, the flow passage extending outside the storage space from the third plane to the first plane; a first deadening wall member coupled to the box-shaped enclosure so as to close the storage space at the first plane; a second deadening wall member coupled to the box-shaped enclosure so as to close the flow passage at the first plane; a first through opening formed in the first deadening wall member; a second through opening formed in the second deadening wall member; a first auxiliary box-shaped enclosure connected to the first deadening wall member, the first auxiliary box-shaped enclosure defining a first ventilation opening at the position farthest from the first through opening; and a second auxiliary box-shaped enclosure connected to the second deadening wall member, the second auxiliary box-shaped enclosure defining a second ventilation opening at a position farthest from the second through opening.

The storage box allows an electronic apparatus or apparatuses to be enclosed in the box-shaped enclosure. The electronic apparatus or apparatuses are inserted into the storage space through the first plane. The first plane is closed with the first and second auxiliary box-shaped enclosures. The storage space is connected to the fresh air through a path including the first ventilation opening, the first auxiliary space and the first through opening and through a path including the second ventilation opening, the second auxiliary space, the second through opening and the flow passage. The electronic apparatus or apparatuses generate operating sound during the operation. The deadening wall or walls of the box-shaped enclosure and the first and second deadening wall members serve to prevent the leakage of the operating sound. The operating sound also leaks through the first and second through openings at the first plane of the box-shaped enclosure into the first and second auxiliary spaces, respectively. The operating sound then leaks out of the first and second ventilation openings. Since the path of sound transmission is restricted, the leakage of the sound is reduced. Noise is thus reduced. In particular, the first and second ventilation openings are formed at the positions farthest from the first and second through openings, respectively. In other words, a distance is established between the first ventilation opening and the first through opening in the first auxiliary space. Likewise, a distance is established between the second ventilation opening and the second through opening in the second auxiliary space. The transmission of the operating sound is in this manner effectively suppressed. Noise is reliably reduced. Moreover, the two paths for airflow are established within the storage box as described above. The paths for an introduced airflow and an exhausted airflow air can be separately established. The introduced airflow can be separated from the discharging airflow. The electronic apparatus or apparatuses can thus effectively be cooled. In addition, the first and second ventilation openings are collectively placed at the first plane. The storage box can be flexibly placed. Here, a deadening wall member may removably be attached to close the second plane. Alternatively, the deadening wall may be attached for relative swinging movement for opening and closing the second plane. The electronic apparatus or apparatuses may be inserted into or removed out of the storage box through the second plane.

The first and second deadening wall members and the first and second auxiliary box-shaped enclosures may removably be coupled to the box-shaped enclosure. The first and second deadening wall members and the first and second auxiliary box-shaped enclosures can be removed in a facilitated manner. The maintenance of the electronic apparatus or apparatuses can be realized within the box-shaped enclosure in a facilitated manner. The first and second deadening wall members and the first and second auxiliary box-shaped enclosures can be replaced in a facilitated manner.

The deadening wall or walls of the box-shaped enclosure and the first and second sound insulating members may be made of a sound insulating material, for example. The sound insulating material is capable of blocking sound transmission. The leakage of the sound is thus prevented. An acoustic material may be attached to the inner surface of the box-shaped enclosure and the inner surfaces of the first and second deadening wall members. The acoustic material is capable of absorbing sound. The leakage of the sound from the first and second ventilation openings is thus reduced.

According to a fifth aspect of the present invention, there is provided a storage box for an electronic apparatus, comprising: a box-shaped enclosure including a deadening wall or walls defining a storage space between first and second planes, the storage space being open at the first and second planes; a deadening wall member supported on the box-shaped enclosure, the deadening wall member extending along the first plane; an auxiliary box-shaped enclosure connected to the box-shaped enclosure so as to close the first plane of the box-shaped enclosure, the auxiliary box-shaped enclosure including a deadening wall or walls defining an auxiliary space isolated from the storage space with the deadening wall member; a through opening formed in the deadening wall member so as to spatially connect the storage space to the auxiliary space; and a ventilation opening formed on the auxiliary box-shaped enclosure at a position opposed to the deadening wall member.

The storage box allows an electronic apparatus or apparatuses to be enclosed in the box-shaped enclosure. The electronic apparatus or apparatuses are inserted into the storage space through the first or second plane. The first plane is closed with the auxiliary box-shaped enclosure. The storage space is connected to the fresh air through the ventilation opening, the auxiliary space and the through opening. The electronic apparatus or apparatuses generate operating sound or noise during the operation. The deadening wall or walls of the box-shaped enclosure and the deadening wall member serve to prevent the leakage of the operating sound. The operating sound also leaks through the through opening at the first plane of the box-shaped enclosure into the auxiliary space. The deadening wall of the auxiliary space serves to prevent the leakage of the sound. The operating sound in the auxiliary space leaks out of the ventilation opening. Since the path of sound transmission is restricted, the leakage of the sound is reduced. Noise is thus reduced. In particular, the ventilation opening is opposed to the deadening wall member. In other words, the position of the ventilation opening is shifted from that of the through opening. The operating sound leaking through the through opening collides against the wall member of the auxiliary box-shaped enclosure. The transmission of the sound is in this manner effectively suppressed. Noise is reliably reduced. Moreover, the storage box allows establishment of a flow passage for airflow at the first plane of the box-shaped enclosure based on the through opening, the auxiliary space and the ventilation opening. The fresh air can reliably be introduced into the storage space. The electronic apparatus or apparatuses can thus effectively be cooled.

The deadening wall or walls of the box-shaped enclosure and the deadening wall of the auxiliary box-shaped enclosure may be made of a sound insulating material, for example. The sound insulating material is capable of blocking sound transmission. The leakage of the sound is thus prevented. An acoustic material may be attached to the inner surface of the box-shaped enclosure and the inner space of the auxiliary box-shaped enclosure. The acoustic material is capable of absorbing sound. The leakage of the sound from the ventilation opening is thus reduced.

The storage box may further comprise a door including the deadening wall member and the auxiliary box-shaped enclosure, the door coupled to the box-shaped enclosure for opening and closing the first plane. The deadening wall member and the auxiliary box-shaped enclosure are in this manner opened/closed in a facilitated manner. The maintenance of the electronic apparatus or apparatuses can be realized within the box-shaped enclosure in a facilitated manner.

The storage box may further comprise: a step formed on one of the box-shaped enclosure and the door around the storage space; and a protrusion formed on the other of the box-shaped enclosure and the door around the storage space, the protrusion being engaged with the step. When the door is closed, the protrusion and the step are engaged with each other between the door and the box-shaped enclosure. The engagement of the protrusion and the step serves to eliminate a gap or gaps between the door and the box-shaped enclosure. No sound leaks out from the gap or gaps. The operating sound of the electronic apparatus or apparatuses during the operation is effectively locked within the storage space.

Alternatively, the storage box may further comprise: a groove formed on one of the box-shaped enclosure and the door around the storage space; and a protrusion formed on the other of the box-shaped enclosure and the door around the storage space, the protrusion being received in the groove.

When the door is closed, the protrusion is received in the groove between the door and the box-shaped enclosure. The engagement of the protrusion with the groove serves to eliminate a gap or gaps between the door and the box-shaped enclosure. No sound leaks out from the gap or gaps. The operating sound of the electronic apparatus or apparatuses during the operation is effectively locked within the storage space.

Otherwise, the storage box may further comprise: a first elastic packing attached to either one of the box-shaped enclosure and the door around the storage space; and a second elastic packing attached to either one of the box-shaped enclosure and the door around the storage space at a position outside the first elastic packing. When the door is closed, the first elastic packing and the second elastic packing are interposed between the door and the box-shaped enclosure so that the first elastic packing and the second elastic packing elastically deform. The first and second elastic packings serve to eliminate a gap or gaps between the door and the box-shaped enclosure around the storage space. The storage space is in this manner air-tightly isolated from a space outside the door. The transmission of the sound is suppressed. In particular, a predetermined interval is preferably established between the first elastic packing and the second elastic packing. The predetermined interval serves to prevent the leakage of sound with enhanced effectiveness.

The storage box may further comprise: a second deadening wall member supported on the box-shaped enclosure, the second deadening wall member extending along the second plane; a second auxiliary box-shaped enclosure connected to the box-shaped enclosure so as to close the second plane, the second auxiliary box-shaped enclosure including a deadening wall or walls defining a second auxiliary space isolated from the storage space with the second deadening wall member; a second through opening formed in the second deadening wall member so as to spatially connect the storage space to the second auxiliary space; and a second ventilation opening formed on the second auxiliary box-shaped enclosure at a position opposed to the second deadening wall member. The second plane of the box-shaped enclosure is closed with the second auxiliary box-shaped enclosure. The storage space is connected to the fresh air not only through the aforementioned path including the through opening, the auxiliary space and the ventilation opening but also through a path including the second through opening, the second auxiliary space and the second ventilation opening. The deadening wall or walls of the box-shaped enclosure, the deadening wall member and the second deadening wall member serve to prevent the leakage of the operating sound during the operation of the electronic apparatus or apparatuses. The operating sound also leaks out of the ventilation opening at the first plane of the box-shaped enclosure as described above. Likewise, the operating sound leaks through the second through opening at the second plane of the box-shaped enclosure into the second auxiliary space. The deadening wall or walls of the second auxiliary space serves to prevent the leakage of the sound. The operating sound then leaks out of the second ventilation opening. Since the path of sound transmission is significantly restricted, the leakage of the sound is reduced. Noise is thus reduced with enhanced reliability. In particular, the second ventilation opening is opposed to the second deadening wall member. In other words, the position of the second ventilation opening is shifted from that of the second through opening. The operating sound leaking out of the second through opening collides against the wall member of the second auxiliary box-shaped enclosure. The transmission of the operating sound is in this manner effectively suppressed. Noise is reliably reduced. Moreover, the storage box allows establishment of a flow passage for airflow at the first plane of the box-shaped enclosure based on the through opening, the auxiliary space and the ventilation opening. The storage box likewise allows establishment of a flow passage for airflow at the second plane based on the second through opening, the second auxiliary space and the second ventilation opening. The fresh air can reliably be introduced into the storage space. The electronic apparatus or apparatuses can thus effectively be cooled.

The deadening wall or walls of the box-shaped enclosure and of the second auxiliary box-shaped enclosure may be made of a sound insulating material, for example. The sound insulating material is capable of blocking sound transmission. The leakage of the sound is thus prevented. An acoustic material may be attached to the inner surface of the box-shaped enclosure and the inner surface of the second auxiliary box-shaped enclosure. The acoustic material is capable of absorbing sound. The leakage of the sound from the second ventilation opening is thus reduced.

The storage box may further comprise a second door including the second deadening wall member and the second auxiliary box-shaped enclosure, the second door coupled to the box-shaped enclosure for opening and closing the second plane. The second deadening wall member and the second auxiliary box-shaped enclosure are in this manner opened and closed in a facilitated manner. The maintenance of the electronic apparatus or apparatuses can be realized within the box-shaped enclosure in a facilitated manner.

The storage box may further comprise: a step formed on one of the box-shaped enclosure and the second door around the storage space; and a protrusion formed on the other of the box-shaped enclosure and the second door around the storage space, the protrusion being engaged with the step. When the second door is closed, the protrusion and the step are engaged with each other between the second door and the box-shaped enclosure. The engagement of the protrusion and the step serves to eliminate a gap or gaps between the second door and the box-shaped enclosure. No sound leaks out from the gap or gaps. The operating sound of the electronic apparatus or apparatuses during the operation is effectively locked within the storage space.

Alternatively, the storage box may further comprise: a groove formed on one of the box-shaped enclosure and the second door around the storage space; and a protrusion formed on the other of the box-shaped enclosure and the second door around the storage space, the protrusion being received in the groove. When the second door is closed, the protrusion is received in the groove between the second door and the box-shaped enclosure. The engagement of the protrusion with the groove serves to eliminate a gap or gaps between the second door and the box-shaped enclosure. No sound leaks out from the gap or gaps. The operating sound of the electronic apparatus or apparatuses during the operation is effectively locked within the storage space.

Otherwise, the storage box may further comprise: a first elastic packing attached to either one of the box-shaped enclosure and the second door around the storage space; and a second elastic packing attached to either one of the box-shaped enclosure and the second door around the storage space at a position outside the first elastic packing. When the second door is closed, the first elastic packing and the second elastic packing are interposed between the second door and the box-shaped enclosure so that the first elastic packing and the second elastic packing elastically deform. The first and second elastic packings serve to eliminate a gap or gaps between the second door and the box-shaped enclosure around the storage space. The storage space is in this manner air-tightly isolated from a space outside the second door. The transmission of the sound is suppressed. In particular, a predetermined interval is preferably established between the first elastic packing and the second elastic packing. The predetermined interval serves to prevent the leakage of sound with enhanced effectiveness.

According to a sixth aspect of the present invention, there is provided a storage box for an electronic apparatus, comprising: a box-shaped enclosure including a deadening wall or walls defining a storage space between first and second planes, the storage space being open at the first and second planes; a deadening wall member supported on the box-shaped enclosure, the deadening wall member extending along the first plane; an auxiliary box-shaped enclosure connected to the box-shaped enclosure so as to close the first plane of the box-shaped enclosure, the auxiliary box-shaped enclosure including a deadening wall or walls defining an auxiliary space isolated from the storage space with the deadening wall member; a through opening formed in the deadening wall member so as to spatially connect the storage space to the auxiliary space; and a ventilation opening formed on the auxiliary box-shaped enclosure at the position farthest from the through opening.

The storage box allows an electronic apparatus or apparatuses to be enclosed in the box-shaped enclosure. The electronic apparatus or apparatuses are inserted into the storage space through the first or second plane. The first plane is closed with the auxiliary box-shaped enclosure. The storage space is connected to the fresh air through the ventilation opening, the auxiliary space and the through opening. The electronic apparatus or apparatuses generate operating sound or noise during the operation. The deadening wall or walls of the box-shaped enclosure and the deadening wall member serve to prevent the leakage of the operating sound. The operating sound leaks out through the through opening at the first plane of the box-shaped enclosure into the auxiliary space. The deadening wall or walls of the auxiliary space serves to prevent the leakage of the operating sound. The operating sound in the auxiliary space thus leaks out of the ventilation opening. Since the path of sound transmission is restricted, the leakage of the sound is reduced. Noise is thus reduced. In particular, the ventilation opening is formed at the position farthest from the through opening. In other words, a distance is established between the ventilation opening and the through opening within the auxiliary space. The transmission of sound is in this manner effectively suppressed. Noise is reliably reduced. Moreover, the storage box allows establishment of a flow passage for airflow at the first plane of the box-shaped enclosure based on the through opening, the auxiliary space and the ventilation opening. The fresh air can reliably be introduced into the storage space. The electronic apparatus or apparatuses can thus effectively be cooled.

The deadening wall or walls of the box-shaped enclosure and the deadening wall member may be made of a sound insulating material, for example. The sound insulating material is capable of blocking sound transmission. The leakage of the sound is thus prevented. An acoustic material may be attached to the inner surface of the box-shaped enclosure and the inner surface of the deadening wall member. The acoustic material is capable of absorbing sound. The leakage of the sound from the ventilation opening is thus reduced.

The storage box may further comprise a door including the deadening wall member and the auxiliary box-shaped enclosure, the door coupled to the box-shaped enclosure for opening and closing the first plane. The deadening wall member and the auxiliary box-shaped enclosure are in this manner opened/closed in a facilitated manner. The maintenance of the electronic apparatus or apparatuses can be realized within the box-shaped enclosure in a facilitated manner.

The storage box may further comprise: a step formed on one of the box-shaped enclosure and the door around the storage space; and a protrusion formed on the other of the box-shaped enclosure and the door around the storage space, the protrusion being engaged with the step. When the door is closed, the protrusion and the step are engaged with each other between the door and the box-shaped enclosure. The engagement of the protrusion and the step serves to eliminate a gap or gaps between the door and the box-shaped enclosure. No sound leaks from the gap or gaps. The operating sound of the electronic apparatus or apparatuses during the operation is effectively locked within the storage space.

Alternatively, the storage box may further comprise: a groove formed on one of the box-shaped enclosure and the door around the storage space; and a protrusion formed on the other of the box-shaped enclosure and the door, the protrusion being received in the groove. When the door is closed, the protrusion is received in the groove between the door and the box-shaped enclosure. The engagement of the protrusion with the groove serves to eliminate a gap or gaps between the door and the box-shaped enclosure. No sound leaks from the gap or gaps. The operating sound of the electronic apparatus or apparatuses during the operation is effectively locked within the storage space.

Otherwise, the storage box may further comprise: a first elastic packing attached to either one of the box-shaped enclosure and the door around the storage space; and a second elastic packing attached to either one of the box-shaped enclosure and the door around the storage space at a position outside the first elastic packing. When the door is closed, the first elastic packing and the second elastic packing are interposed between the door and the box-shaped enclosure so that the first elastic packing and the second elastic packing elastically deform. The first and second elastic packings serve to eliminate a gap or gaps between the door and the box-shaped enclosure around the storage space. The storage space is in this manner air-tightly isolated from a space outside the door. The transmission of the sound is suppressed. In particular, a predetermined interval is preferably established between the first elastic packing and the second elastic packing. The predetermined interval serves to prevent the leakage of sound with enhanced effectiveness.

The storage box may further comprise: a second deadening wall member supported on the box-shaped enclosure, the second deadening wall member extending along the second plane; a second auxiliary box-shaped enclosure connected to the box-shaped enclosure so as to close the second plane of the box-shaped enclosure, the second auxiliary box-shaped enclosure including a deadening wall or walls defining a second auxiliary space isolated from the storage space with the second deadening wall member; a second through opening formed in the second deadening wall member so as to spatially connect the storage space to the second auxiliary space; and a second ventilation opening formed on the second auxiliary box-shaped enclosure at the position farthest from the second through opening. The second plane of the box-shaped enclosure is close with the second auxiliary box-shaped enclosure. The storage space is connected to the fresh air not only through the aforementioned path including the through opening, the auxiliary space and the ventilation opening but also through a path including the second through opening, the second auxiliary space and the second ventilation opening. The deadening wall or walls of the box-shaped enclosure, the deadening wall member and the second deadening wall member serve to prevent the leakage of the operating sound during the operation of the electronic apparatus or apparatuses. The operating sound also leaks out of the ventilation opening at the first plane of the box-shaped enclosure as described above. Likewise, the operating sound leaks out through the second through opening at the second plane of the box-shaped enclosure into the second auxiliary space. The deadening wall or walls of the second auxiliary space serves to prevent the leakage of the operating sound. The operating sound then leaks out of the second ventilation opening. Since the path of sound transmission is significantly restricted, the leakage of the sound is reduced. Noise is thus reduced with enhanced reliability. In particular, the second ventilation opening is formed on the second auxiliary box-shaped enclosure at the position farthest from the second through opening. In other words, a distance is established between the second ventilation opening and the second through opening within the second auxiliary space. The transmission of sound is in this manner effectively suppressed. Moreover, the storage box allows establishment of a flow passage for airflow at the first plane of the box-shaped enclosure based on the through opening, the auxiliary space and the ventilation opening. The storage box likewise allows establishment of a flow passage for airflow at the second plane based on the second through opening, the second auxiliary space and the second ventilation opening. The fresh air can reliably be introduced into the storage space. The electronic apparatus or apparatuses can thus effectively be cooled.

The deadening wall or walls of the box-shaped enclosure and the deadening wall or walls of the second auxiliary box-shaped enclosure may be made of a sound insulating material, for example. The sound insulating material is capable of blocking sound transmission. The leakage of the sound is thus prevented. An acoustic material may be attached to the inner surface of the box-shaped enclosure and the inner surface of the second auxiliary box-shaped enclosure. The acoustic material is capable of absorbing sound. The leakage of the sound from the second ventilation opening is thus reduced.

The storage box may further comprise a second door including the second deadening wall member and the second auxiliary box-shaped enclosure, the second door coupled to the box-shaped enclosure for opening and closing the second plane. The second deadening wall member and the second auxiliary box-shaped enclosure are in this manner opened and closed in a facilitated manner. The maintenance of the electronic apparatus or apparatuses can be realized within the box-shaped enclosure in a facilitated manner.

The storage box may further comprise: a step formed on one of the box-shaped enclosure and the second door around the storage space; and a protrusion formed on the other of the box-shaped enclosure and the second door around the storage space, the protrusion being engaged with the step. When the second door is closed, the protrusion and the step are engaged with each other between the second door and the box-shaped enclosure. The engagement of the protrusion and the step serves to eliminate a gap or gaps between the second door and the box-shaped enclosure. No sound leaks from the gap or gaps. The operating sound of the electronic apparatus or apparatuses during the operation is effectively locked within the storage space.

Alternatively, the storage box may further comprise: a groove formed on one of the box-shaped enclosure and the second door around the storage space; and a protrusion formed on the other of the box-shaped enclosure and the second door around the storage space, the protrusion being received in the groove. When the second door is closed, the protrusion is received in the groove between the second door and the box-shaped enclosure. The engagement of the protrusion with the groove serves to eliminate a gap or gaps between the second door and the box-shaped enclosure. No sound leaks out from the gap or gaps. The operating sound of the electronic apparatus or apparatuses during the operation is effectively locked within the storage space.

Otherwise, the storage box may further comprise: a first elastic packing attached to either one of the box-shaped enclosure and the second door around the storage space; and a second elastic packing attached to either one of the box-shaped enclosure and the second door around the storage space at a position outside the first elastic packing. When the second door is closed, the first elastic packing and the second elastic packing are interposed between the second door and the box-shaped enclosure so that the first elastic packing and the second elastic packing elastically deform. The first and second elastic packings serve to eliminate a gap or gaps between the second door and the box-shaped enclosure around the storage space. The storage space is in this manner air-tightly isolated from a space outside the second door. The transmission of the sound is suppressed. In particular, a predetermined interval is preferably established between the first elastic packing and the second elastic packing. The predetermined interval serves to prevent the leakage of sound with enhanced effectiveness.

According to a seventh aspect of the present invention, there is provided a storage box for an electronic apparatus, comprising: a box-shaped enclosure defining a storage space; a door coupled to the box-shaped enclosure for opening and closing the opening of the storage space; a first elastic packing extending around the opening of the storage space, the first elastic packing attached to either one of the box-shaped enclosure and the door; and a second elastic packing extending around the opening of the storage space in parallel with the first elastic packing at a position spaced from the first elastic packing at a predetermined interval, the second elastic packing attached to either one of the box-shaped enclosure and the door.

When the door is closed, the first elastic packing and the second elastic packing are interposed between the door and the box-shaped enclosure so that the first elastic packing and the second elastic packing elastically deform. The first and second elastic packings serve to eliminate a gap or gaps between the door and the box-shaped enclosure around the storage space. The storage space is in this manner air-tightly isolated from a space outside the door. The transmission of the sound is suppressed. In particular, a predetermined interval is preferably established between the first elastic packing and the second elastic packing. The predetermined interval serves to prevent the leakage of sound with enhanced effectiveness.

According to an eighth aspect of the present invention, there is provided a storage box for an electronic apparatus, comprising: a box-shaped enclosure including a deadening wall or walls defining a storage space between first and second planes, the storage space being open at the first and second planes; a deadening wall member supported on the box-shaped enclosure, the deadening wall member extending along the first plane; an auxiliary box-shaped enclosure connected to the box-shaped enclosure so as to close the first plane of the box-shaped enclosure, the auxiliary box-shaped enclosure defining an auxiliary space isolated from the storage space with the deadening wall member; a through opening formed in the deadening wall member so as to spatially connect the storage space to the auxiliary space; a ventilating unit mounted in the through opening; and a ventilation opening formed on the auxiliary box-shaped enclosure at a position opposed to the deadening wall member.

The storage box allows an electronic apparatus or apparatuses to be enclosed in the box-shaped enclosure. The electronic apparatus or apparatuses are inserted into the storage space through the first or second plane. The first plane is closed with the auxiliary box-shaped enclosure. The storage space is connected to the fresh air through the ventilation opening, the auxiliary space and the through opening. The electronic apparatus or apparatuses generate operating sound or noise during the operation. The deadening wall or walls of the box-shaped enclosure and the deadening wall member serve to prevent the leakage of the sound. The operating sound leaks through the through opening at the first plane of the box-shaped enclosure into the auxiliary space. The operating sound then leaks out of the ventilation opening. Since the path of sound transmission is restricted, the leakage of the sound is reduced. Noise is thus reduced. In particular, the ventilation opening is opposed to the deadening wall member. In other words, the position of the ventilation opening is shifted from that of the through opening. The operating sound leaking through the through opening collides against the wall member of the auxiliary box-shaped enclosure. The transmission of the sound is in this manner effectively suppressed. Noise is reliably reduced. Moreover, the storage box allows establishment of a flow passage for airflow at the first plane of the box-shaped enclosure based on the through opening, the auxiliary space and the ventilation opening. The ventilating unit is utilized to forcefully generate the airflow. The airflow is allowed to run through the storage space. Even if the opening area of the through opening and the ventilation opening is reduced, the fresh air of a sufficient amount can reliably be introduced into the storage space. The electronic apparatus or apparatuses can thus effectively be cooled.

The ventilating unit may include at least one ventilator fixed to the deadening wall member, the ventilator or ventilators being individually removable from the deadening wall member. The ventilating unit allows a separate or individual removal of the ventilator or ventilators from the deadening wall member. This leads to a separate or individual replacement of the ventilator or ventilators.

The storage box may further comprise: a second deadening wall member supported on the box-shaped enclosure, the second deadening wall member extending along the second plane; a second auxiliary box-shaped enclosure connected to the box-shaped enclosure so as to close the second plane, the second auxiliary box-shaped enclosure defining a second auxiliary space isolated from the storage space with the second deadening wall member; a second through opening formed in the second deadening wall member so as to spatially connect the storage space to the second auxiliary space; a second ventilating unit mounted in the second through opening; and a second ventilation opening formed on the second auxiliary box-shaped enclosure at a position opposed to the second deadening wall member. The second plane of the box-shaped enclosure is closed with the second auxiliary box-shaped enclosure. The storage space is connected to the fresh air not only through the aforementioned path including the through opening, the auxiliary space and the ventilation opening but also through a path including the second through opening, the second auxiliary space and the second ventilation opening. The deadening wall or walls of the box-shaped enclosure, the deadening wall member and the second deadening wall member serve to prevent the leakage of the sound during the operation of the electronic apparatus or apparatuses. The operating sound leaks out of the ventilation opening at the first plane of the box-shaped enclosure as described above. Likewise, the operating sound leaks through the second through opening at the second plane of the box-shaped enclosure into the second auxiliary space. The operating sound then leaks out of the second ventilation opening. Since the path of the sound transmission is significantly restricted, the leakage of the sound is reduced. Noise is thus reduced with enhanced reliability. In particular, the second ventilation opening is opposed to the second deadening wall member. In other words, the position of the second ventilation opening is shifted from that of the second through opening. The operating sound leaking through the second through opening collides against the wall member of the second auxiliary box-shaped enclosure. The transmission of the sound is in this manner effectively suppressed. Noise is reliably reduced. Moreover, the storage box allows establishment of a flow passage for airflow at the first plane of the box-shaped enclosure based on the through opening, the auxiliary space and the ventilation opening. The storage box likewise allows establishment of a flow passage for airflow at the second plane based on the second through opening, the second auxiliary space and the second ventilation opening. The second ventilating unit is utilized to forcefully generate airflow. The airflow is allowed to run through the storage space. Even if the opening area of the second through opening and the second ventilation opening is reduced, the fresh air of a sufficient amount can reliably be introduced into the storage space. The electronic apparatus or apparatuses can thus effectively be cooled.

The second ventilating unit of the storage box may include a group of ventilators identical to a group of ventilators incorporated in the ventilating unit. The opening area of the second through opening is set equal to the opening area of the through opening. This results in minimization of the opening area in each of the deadening wall member and the second deadening wall member. The second ventilating unit may have a performance equivalent to the performance of the ventilating unit. Slack of airflow can be avoided in the storage space. No swirl is generated in the storage space.

The ventilating unit may include at least one ventilator fixed to the deadening wall member, the ventilator or ventilators being individually removable from the deadening wall member. The ventilating unit allows a separate removal of the ventilator or ventilators from the deadening wall member. This leads to a separate replacement of the ventilator or ventilators. Likewise, the second ventilating unit may include at least one ventilator fixed to the second deadening wall member, the ventilator or ventilators being individually removable from the second deadening wall member.

According to a ninth aspect of the present invention there is provided a storage box for an electronic apparatus, comprising: a box-shaped enclosure including a deadening wall or walls defining a storage space between first and second planes, the storage space being open at the first and second planes; a deadening wall member supported on the box-shaped enclosure, the deadening wall member extending along the first plane; an auxiliary box-shaped enclosure connected to the box-shaped enclosure so as to close the first plane of the box-shaped enclosure, the auxiliary box-shaped enclosure defining an auxiliary space isolated from the storage space with the deadening wall member; a through opening formed in the deadening wall member so as to spatially connect the storage space to the auxiliary space; a ventilating unit mounted in the through opening; and a ventilation opening formed in the auxiliary box-shaped enclosure at the position farthest from the through opening.

The storage box allows an electronic apparatus or apparatuses to be enclosed in the box-shaped enclosure. The electronic apparatus or apparatuses are inserted into the storage space through the first or second plane. The first plane is closed with the auxiliary box-shaped enclosure. The storage space is connected to the fresh air through the ventilation opening, the auxiliary space and the through opening. The electronic apparatus or apparatuses generate operating sound or noise during the operation. The deadening wall or walls of the box-shaped enclosure and the deadening wall member serve to prevent the leakage of the sound. The operating sound leaks out through the through opening at the first plane of the box-shaped enclosure into the auxiliary space. The operating sound then leaks out of the ventilation opening. Since the path of sound transmission is restricted, the leakage of the sound is reduced. Noise is thus reduced. In particular, the ventilation opening is formed at the position farthest from the through opening. In other words, a distance is established between the ventilation opening and the through opening within the auxiliary space. The transmission of the sound is in this manner effectively suppressed. Noise is reliably reduced. Moreover, storage box allows establishment of a flow passage for airflow at the first plane of the box-shaped enclosure based on the through opening, the auxiliary space and the ventilation opening. The ventilating unit is utilized to forcefully generate airflow. The airflow is allowed to run through the storage space. Even if the opening area of the through opening and the ventilation opening is reduced, the fresh air of a sufficient amount can reliably be introduced into the storage space. The electronic apparatus or apparatuses can thus effectively be cooled.

The ventilating unit may include at least one ventilator fixed to the deadening wall member, the ventilator or ventilators being individually removable from the deadening wall member. The ventilating unit allows a separate or individual removal of the ventilator or ventilators from the deadening wall member. This leads to a separate or individual replacement of the ventilator or ventilators.

The storage box may further comprise: a second deadening wall member supported on the box-shaped enclosure, the second deadening wall member extending along the second plane; a second auxiliary box-shaped enclosure connected to the box-shaped enclosure so as to close the second plane, the second auxiliary box-shaped enclosure defining a second auxiliary space isolated from the storage space with the second deadening wall member; a second through opening formed in the second deadening wall member so as to spatially connect the storage space to the second auxiliary space; a second ventilating unit mounted in the second through opening; and a second ventilation opening formed on the second auxiliary box-shaped enclosure at the position farthest from the second through opening. The second plane of the box-shaped enclosure is closed with the second auxiliary box-shaped enclosure. The storage space is connected to the fresh air not only through the aforementioned path including the through opening, the auxiliary space and the ventilation opening but also through a path including the second through opening, the second auxiliary space and the second ventilation opening. The deadening wall or walls of the box-shaped enclosure, the deadening wall member and the second deadening wall member serve to prevent the leakage of the sound during the operation of the electronic apparatus or apparatuses. The operating sound leaks out of the ventilation opening at the first plane of the box-shaped enclosure as described above. Likewise, the operating sound leaks through the second through opening at the second plane of the box-shaped enclosure into the second auxiliary space. The operating sound then leaks out of the second ventilation opening. Since the path of the sound transmission is significantly restricted, the leakage of the sound is reduced. Noise is thus reduced with enhanced reliability. In particular, the second ventilation opening is formed at the farthest position from the second through opening. In other words, a distance is established between the second ventilation opening and the second through opening within the second auxiliary space. The transmission of the sound is in this manner effectively suppressed. Noise is reliably reduced. Moreover, the storage box allows establishment of a flow passage for airflow at the first plane of the box-shaped enclosure based on the through opening, the auxiliary space and the ventilation opening. The storage box likewise allows establishment of a flow passage for airflow at the second plane based on the second through opening, the second auxiliary space and the second ventilation opening. The second ventilating unit is utilized to forcefully generate airflow. The airflow is allowed to run through the storage space. Even if the opening area of the second through opening and the second ventilation opening is reduced, the fresh air of a sufficient amount can reliably be introduced into the storage space. The electronic apparatus or apparatuses can thus effectively be cooled.

The second ventilating unit of the storage box may include a group of ventilators identical to a group of ventilators incorporated in the ventilating unit. The opening area of the second through opening is set equal to the opening area of the through opening. This results in minimization of the opening area in each of the deadening wall member and the second deadening wall member. The second ventilating unit may have a performance equivalent to the performance of the ventilating unit. Slack of airflow can be avoided in the storage space. No swirl is generated in the storage space.

The ventilating unit may include at least one ventilator fixed to the deadening wall member, the ventilator or ventilators being individually removable from the deadening wall member. The ventilating unit allows a separate removal of the ventilator or ventilators from the deadening wall member. This leads to a separate replacement of the ventilator or ventilators. Likewise, the second ventilating unit may include at least one ventilator fixed to the second deadening wall member, the ventilator or ventilators being individually removable from the second deadening wall member.

According to a tenth aspect of the present invention, there is provided a storage box for an electronic apparatus, comprising: a box-shaped enclosure including a deadening wall or walls defining a storage space between first and second planes, the storage space being open at the first and second planes; a rack placed within the storage space, the rack defining a rack space to enclose at least one electronic apparatus; a deadening wall member supported on the box-shaped enclosure, the deadening wall member extending along the first plane; an auxiliary box-shaped enclosure connected to the box-shaped enclosure so as to close the first plane of the box-shaped enclosure, the auxiliary box-shaped enclosure defining an auxiliary space isolated from the storage space with the deadening wall member; a through opening formed in the deadening wall member so as to spatially connect the storage space to the auxiliary space; a ventilating unit mounted in the through opening; a ventilation opening formed in the auxiliary box-shaped enclosure at a position opposed to the deadening wall member; at least one thermal sensor placed in a space between the deadening wall member and the rack space; and a controller circuit connected to the thermal sensor, the controller circuit designed to control operation of the ventilating unit based on a temperature detected at the thermal sensor.

The storage box allows an electronic apparatus or apparatuses to be enclosed in the box-shaped enclosure. The electronic apparatus or apparatuses are inserted into the storage space through the first or second plane. The electronic apparatus or apparatuses are mounted on the rack. The first plane is closed with the auxiliary box-shaped enclosure. The storage space is connected to the fresh air through the ventilation opening, the auxiliary space and the through opening. The electronic apparatus or apparatuses generate operating sound or noise during the operation. The deadening wall or walls of the box-shaped enclosure and the deadening wall member serve to prevent the leakage of the sound. The operating sound leaks through the through opening at the first plane of the box-shaped enclosure into the auxiliary space. The operating sound then leaks out of the ventilation opening. Since the path of sound transmission is restricted, the leakage of the sound is reduced. Noise is thus reduced. In particular, the ventilation opening is opposed to the deadening wall member. In other words, the position of the ventilation opening is shifted from that of the through opening. The operating sound leaking through the through opening collides against the wall member of the auxiliary box-shaped enclosure. The transmission of the operating sound is in this manner effectively suppressed. Noise is reliably reduced. Moreover, the storage box allows establishment of a flow passage for airflow at the first plane of the box-shaped enclosure based on the through opening, the auxiliary space and the ventilation opening. The ventilating unit is utilized to forcefully generate airflow. The airflow is allowed to run through the storage space. Even if the opening area of the through opening and the ventilation opening is reduced, the fresh air of a sufficient amount can reliably be introduced into the storage space. The electronic apparatus or apparatuses can thus effectively be cooled.

In this case, the thermal sensor detects the temperature of the air in the storage space. The controller circuit is designed to control the operation of the ventilating unit based on the detected temperature of the air. The flow rate of the ventilating unit can be determined depending on the temperature of the air. The fresh air of an appropriate amount can thus always be introduced into the storage space. The electronic apparatus or apparatuses can effectively be cooled. The thermal sensor is preferably placed outside the rack space at a position distanced from the deadening wall member.

The auxiliary box-shaped enclosure may include: a first outer wall extending in parallel with the deadening wall member; and second and third outer walls opposed to each other, the second and third walls connecting the deadening wall member to the first outer wall. In this case, the through opening may extend along the edge defined between the deadening wall member and the second outer wall. The thermal sensor or sensors may be arranged along the edge defined between the deadening wall member and the third outer wall. With this structure, the fresh air from the through opening hardly reaches the edge between the deadening wall member and the third outer wall. The temperature can thus easily rise at a position near the edge between the deadening wall member and the third outer wall. As long as the temperature is detected at such a position, it is possible to reliably prevent the electronic apparatus or apparatuses from an excessive rise in temperature.

The through opening may be a window opening elongated in the direction of gravity. In general, the electronic apparatuses are arranged in the direction of gravity in the rack. As long as the through opening is elongated in the direction of gravity, all the electronic apparatuses are allowed to equally enjoy the fresh air. All the electronic apparatuses can thus reliably be cooled.

The storage box may further comprise: a door including the deadening wall member and the auxiliary box-shaped enclosure, the door coupled to the box-shaped enclosure for opening and closing the first plane; and a door sensor connected to the controller circuit, the door sensor detecting the opened condition of the door. This structure allows the controller circuit to control the operation of the ventilating unit in response to the opened/closed status of the door. When the door is opened, the operation of the ventilating unit can be stopped.

The storage box may further comprise a display device connected to the controller circuit, the display device displaying the status of the ventilating unit. The display device serves to reliably show the user of the electronic apparatus or apparatuses the status of the ventilating unit. The user can thus reliably be informed of the status of the ventilating unit.

The storage box may further comprise: a second deadening wall member supported on the box-shaped enclosure, the second deadening wall member extending along the second plane; a second auxiliary box-shaped enclosure connected to the box-shaped enclosure so as to close the second plane, the second auxiliary box-shaped enclosure defining a second auxiliary space isolated from the storage space with the second deadening wall member; a second through opening formed in the second deadening wall member so as to spatially connect the storage space to the second auxiliary space; a second ventilating unit mounted in the second through opening; a second ventilation opening formed on the second auxiliary box-shaped enclosure at a position opposed to the second deadening wall member; and at least one second thermal sensor placed in a space between the second deadening wall member and the rack space. The second plane of the box-shaped enclosure is closed with the second auxiliary box-shaped enclosure. The storage space is connected to the fresh air not only through the aforementioned path including the through opening, the auxiliary space and the ventilation opening but also through a path including the second through opening, the second auxiliary space and the second ventilation opening. The deadening wall or walls of the box-shaped enclosure, the deadening wall member and the second deadening wall member serve to prevent the leakage of the sound during the operation of the electronic apparatus or apparatuses. The operating sound leaks out of the ventilation opening at the first plane of the box-shaped enclosure as described above. Likewise, the operating sound leaks through the second through opening at the second plane of the box-shaped enclosure into the second auxiliary space. The operating sound then leaks out of the second ventilation opening. Since the path of the sound transmission is significantly restricted, the leakage of the sound is reduced. Noise is thus reduced with enhanced reliability. In particular, the second ventilation opening is opposed to the second deadening wall member. In other words, the position of the second ventilation opening is shifted from that of the second through opening. The operating sound leaking through the second through opening collides against the wall member of the second auxiliary box-shaped enclosure. The transmission of the sound is in this manner effectively suppressed. Noise is reliably reduced. Moreover, the storage box allows establishment of a flow passage for airflow at the first plane of the box-shaped enclosure based on the through opening, the auxiliary space and the ventilation opening. The storage box likewise allows establishment of a flow passage for airflow at the second plane based on the second through opening, the second auxiliary space and the second ventilation opening. The second ventilating unit is utilized to forcefully generate airflow. The airflow is allowed to run through the storage space. Even if the opening area of the second through opening and the second ventilation opening is reduced, the fresh air of a sufficient amount can reliably be introduced into the storage space. The electronic apparatus or apparatuses can thus effectively be cooled. Here, the second thermal sensor detects the temperature of the air in the storage space. The controller circuit is designed to control the operation of the second ventilating unit based on the detected temperature of the air. The flow rate of the second ventilating unit can be determined depending on the temperature of the air. The fresh air of an appropriate amount can thus always be introduced into the storage space. The electronic apparatus or apparatuses are in this manner effectively cooled. The second thermal sensor is preferably placed outside the rack space at a position distanced from the second deadening wall member.

The second auxiliary box-shaped enclosure may include: a first outer wall extending in parallel with the second deadening wall member; and second and third outer walls opposed to each other, the second and third walls connecting the second deadening wall member to the first outer wall. The second through opening may extend along the edge defined between the second deadening wall member and the second outer wall. The second thermal sensor or sensors may be arranged along the edge defined between the second deadening wall member and the third outer wall. With this structure, the air near the edge between the second deadening wall member and the third outer wall is hardly discharged through the second through opening. The temperature can thus easily rise at a position near the edge between the second deadening wall member and the third outer wall. As long as the temperature is detected at such a position, it is possible to reliably prevent the electronic apparatus or apparatuses from an excessive rise in temperature.

The second through opening may be a window opening elongated in the direction of gravity. In general, the electronic apparatuses are arranged in the direction of gravity in the rack. As long as the second through opening is elongated in the direction of gravity, all the electronic apparatuses are allowed to equally enjoy the fresh air. All the electronic apparatuses can thus be reliably cooled.

The storage box may further comprise: a second door including the second deadening wall member and the second auxiliary box-shaped enclosure, the second door coupled to the box-shaped enclosure for opening and closing the second plane; and a second door sensor detecting the opened condition of the second door. This structure allows the controller circuit to control the operation of the second ventilating unit in response to the opened/closed condition of the second door. When the second door is opened, the operation of the second ventilating unit can be stopped.

According to an eleventh aspect of the present invention, there is provided a storage box for an electronic apparatus, comprising: a box-shaped enclosure including a deadening wall or walls defining a storage space between first and second planes, the storage space being open at the first and second planes; a rack placed within the storage space, the rack defining a rack space to enclose at least one electronic apparatus; a deadening wall member supported on the box-shaped enclosure, the deadening wall member extending along the first plane; an auxiliary box-shaped enclosure connected to the box-shaped enclosure so as to close the first plane of the box-shaped enclosure, the auxiliary box-shaped enclosure defining an auxiliary space isolated from the storage space with the deadening wall member; a through opening formed in the deadening wall member so as to spatially connect the storage space to the auxiliary space; a ventilating unit mounted in the through opening; a ventilation opening formed in the auxiliary box-shaped enclosure at the position farthest from the through opening; at least one thermal sensor placed in a space between the deadening wall member and the rack space; and a controller circuit connected to the thermal sensor, the controller circuit designed to control the operation of the ventilating unit based on a temperature detected by the thermal sensor.

The storage box allows an electronic apparatus or apparatuses to be enclosed in the box-shaped enclosure. The electronic apparatus or apparatuses are inserted into the storage space through the first or second plane. The electronic apparatus or apparatuses are mounted on the rack. The first plane is closed with the auxiliary box-shaped enclosure. The storage space is connected to the fresh air through the ventilation opening, the auxiliary space and the through opening. The electronic apparatus or apparatuses generate operating sound or noise during the operation. The deadening wall or walls of the box-shaped enclosure and the deadening wall member serve to prevent the leakage of the sound. The operating sound leaks through the through opening at the first plane of the box-shaped enclosure into the auxiliary space. The operating sound then leaks out of the ventilation opening. Since the path of sound transmission is restricted, the leakage of the sound is reduced. Noise is thus reduced. In particular, the ventilation opening is formed at the position farthest from the through opening. In other words, a distance is established between the ventilation opening and the through opening within the auxiliary space. The transmission of sound is in this manner effectively suppressed. Noise is reliably reduced. Moreover, the storage box allows establishment of a flow passage for airflow at the first plane of the box-shaped enclosure based on the through opening, the auxiliary space and the ventilation opening. The ventilating unit is utilized to forcefully generate airflow. The airflow is allowed to run through the storage space. Even if the opening area of the through opening and the ventilation opening is reduced, the fresh air of a sufficient amount can reliably be introduced into the storage space. The electronic apparatus or apparatuses can thus effectively be cooled.

In this case, the thermal sensor detects the temperature of the air in the storage space. The controller circuit is designed to control the operation of the ventilating unit based on the detected temperature of the air. The flow rate of the ventilating unit can be determined depending on the temperature of the air. The fresh air of an appropriate amount can thus always be introduced into the storage space. The electronic apparatus or apparatuses can effectively be cooled. The thermal sensor is preferably placed outside the rack space at a position distanced from the deadening wall member.

The auxiliary box-shaped enclosure may include: a first outer wall extending in parallel with the deadening wall member; and second and third outer walls opposed to each other, the second and third walls connecting the deadening wall member to the first outer wall. In this case, the through opening may extend along the edge defined between the deadening wall member and the second outer wall. The thermal sensor or sensors may be arranged along the edge defined between the deadening wall member and the third outer wall. With this structure, the fresh air from the through opening hardly reaches the edge between the deadening wall member and the third outer wall. The temperature can thus easily rise at a position near the edge between the deadening wall member and the third outer wall. As long as the temperature is detected at such a position, it is possible to reliably prevent the electronic apparatus or apparatuses from an excessive rise in temperature.

The through opening may be a window opening elongated in the direction of gravity. In general, the electronic apparatuses are arranged in the direction of gravity in the rack. As long as the through opening is elongated in the direction of gravity, all the electronic apparatuses are allowed to equally enjoy the fresh air. All the electronic apparatuses can thus reliably be cooled.

The storage box may further comprise: a door including the deadening wall member and the auxiliary box-shaped enclosure, the door coupled to the box-shaped enclosure for opening and closing the first plane; and a door sensor connected to the controller circuit, the door sensor detecting the opened condition of the door. This structure allows the controller circuit to control the operation of the ventilating unit in response to the opened/closed status of the door. When the door is opened, the operation of the ventilating unit can be stopped.

The storage box may further comprise a display device connected to the controller circuit, the display device displaying the status of the ventilating unit. The display device serves to reliably show the user of the electronic apparatus or apparatuses the status of the ventilating unit. The user can thus reliably be informed of the status of the ventilating unit.

The storage box may further comprise: a second deadening wall member supported on the box-shaped enclosure, the second deadening wall member extending along the second plane; a second auxiliary box-shaped enclosure connected to the box-shaped enclosure so as to close the second plane, the second auxiliary box-shaped enclosure defining a second auxiliary space isolated from the storage space with the second deadening wall member; a second through opening formed in the second deadening wall member so as to spatially connect the storage space to the second auxiliary space; a second ventilating unit mounted in the second through opening; a second ventilation opening formed in the second auxiliary box-shaped enclosure at the position farthest from the second through opening; and at least one second thermal sensor placed in a space between the second deadening wall member and the rack space. The second plane of the box-shaped enclosure is closed with the second auxiliary box-shaped enclosure. The storage space is connected to the fresh air not only through the aforementioned path including the through opening, the auxiliary space and the ventilation opening but also through a path including the second through opening, the second auxiliary space and the second ventilation opening. The deadening wall or walls of the box-shaped enclosure, the deadening wall member and the second deadening wall member serve to prevent the leakage of the sound during the operation of the electronic apparatus or apparatuses. The operating sound leaks out of the ventilation opening at the first plane of the box-shaped enclosure as described above. Likewise, the operating sound leaks through the second through opening at the second plane of the box-shaped enclosure into the second auxiliary space. The operating sound then leaks out of the second ventilation opening. Since the path of the sound transmission is significantly restricted, the leakage of the sound is reduced. Noise is thus reduced with enhanced reliability. In particular, the second ventilation opening is formed at the farthest position from the second through opening. In other words, a distance is established between the second ventilation opening and the second through opening within the second auxiliary space. The transmission of the sound is in this manner suppressed. Noise is reliably reduced. Moreover, the storage box allows establishment of a flow passage for airflow at the first plane of the box-shaped enclosure based on the through opening, the auxiliary space and the ventilation opening. The storage box likewise allows establishment of a flow passage for airflow at the second plane based on the second through opening, the second auxiliary space and the second ventilation opening. The second ventilating unit is utilized to forcefully generate airflow. The airflow is allowed to run through the storage space. Even if the opening area of the second through opening and the second ventilation opening is reduced, the fresh air of a sufficient amount can reliably be introduced into the storage space. The electronic apparatus or apparatuses can thus effectively be cooled. Here, the second thermal sensor detects the temperature of the air in the storage space. The controller circuit is designed to control the operation of the second ventilating unit based on the detected temperature of the air. The flow rate of the second ventilating unit can be determined depending on the temperature of the air. The fresh air of an appropriate amount can thus always be introduced into the storage space. The electronic apparatus or apparatuses are in this manner effectively cooled. The second thermal sensor is preferably placed outside the rack space at a position distanced from the second deadening wall member.

The second auxiliary box-shaped enclosure may include: a first outer wall extending in parallel with the second deadening wall member; and second and third outer walls opposed to each other, the second and third walls connecting the second deadening wall member to the first outer wall. The second through opening may extend along the edge defined between the second deadening wall member and the second outer wall. The second thermal sensor or sensors may be arranged along the edge defined between the second deadening wall member and the third outer wall. With this structure, the air near the edge between the second deadening wall member and the third outer wall is hardly discharged through the second through opening. The temperature can thus easily rise at a position near the edge between the second deadening wall member and the third outer wall. As long as the temperature is detected at such a position, it is possible to reliably prevent the electronic apparatus or apparatuses from an excessive rise in temperature.

The second through opening may be a window opening elongated in the direction of gravity. In general, the electronic apparatuses are arranged in the direction of gravity in the rack. As long as the second through opening is elongated in the direction of gravity, all the electronic apparatuses are allowed to equally enjoy the fresh air. All the electronic apparatuses can thus be reliably cooled.

The storage box may further comprise: a second door including the second deadening wall member and the second auxiliary box-shaped enclosure, the second door coupled to the box-shaped enclosure for opening and closing the second plane; and a second door sensor detecting the opened condition of the second door. This structure allows the controller circuit to control the operation of the second ventilating unit in response to the opened/closed condition of the second door. When the second door is opened, the operation of the second ventilating unit can be stopped.

According to a twelve aspect of the present invention, there is provided a storage box for an electronic apparatus, comprising: a box-shaped enclosure including a deadening wall or walls defining a storage space between first and second planes, the storage space being open at the first and second planes; an auxiliary box-shaped enclosure connected to the box-shaped enclosure so as to close the first plane of the box-shaped enclosure, the auxiliary box-shaped enclosure including a wall member and an outer wall in cooperation defining an auxiliary space isolated from the storage space with the wall member; a through opening formed in the wall member of the auxiliary box-shaped enclosure so as to spatially connect the storage space to the auxiliary space; and a ventilation opening formed in the outer wall of the auxiliary box-shaped enclosure. Here, the auxiliary space extends from the through opening to the ventilation opening, the auxiliary space bending between the through opening and the ventilation opening.

The storage box allows an electronic apparatus or apparatuses to be enclosed in the box-shaped enclosure. The electronic apparatus or apparatuses are inserted into the storage space through the first or second plane. The first plane is closed with the auxiliary box-shaped enclosure. The storage space is connected to the fresh air through the ventilation opening, the auxiliary space and the through opening. The electronic apparatus or apparatuses generate operating sound or noise during the operation. The deadening wall or walls of the box-shaped enclosure serve to prevent the leakage of the operating sound. The operating sound also leaks out from the through opening at the first plane of the box-shaped enclosure into the auxiliary space. The operating sound then leaks out of the ventilation opening. Since the path of sound transmission is restricted, the leakage of the sound is reduced. Noise is thus reduced. In particular, the auxiliary space bends between the through opening and the ventilation opening. The operating sound leaking through the through opening collides against the wall member of the auxiliary box-shaped enclosure. The transmission of the sound is in this manner effectively suppressed. Noise is reliably reduced. Moreover, the storage box allows establishment of a flow passage for airflow at the first plane of the box-shaped enclosure based on the through opening, the auxiliary space and the ventilation opening. The fresh air can reliably be introduced into the storage space. The electronic apparatus or apparatuses can thus effectively be cooled.

The ventilation opening may be opened at the side of the auxiliary space. Alternatively, the ventilation opening may be opened at the top of the auxiliary space. Otherwise, the ventilation opening may be opened at the bottom of the auxiliary space. The ventilation opening may be placed at a position appropriately determined depending on the placement of the storage box.

The outer wall of the auxiliary box-shaped enclosure may include: a first outer wall member extending in parallel with the wall member; and second and third outer wall members opposed to each other, the second and third wall members connecting the wall member to the first outer wall member. The through opening may extend along the edge defined between the wall member and the second outer wall member. The ventilation opening may extend along the edge defined between the first outer wall member and the third outer wall member. The ventilation opening is in this manner sufficiently distanced from the through opening. The sound transmission is further reduced.

The through opening may be a window opening elongated in the direction of gravity. Likewise, the ventilation opening may be a window opening elongated in the direction of gravity. In addition, the auxiliary space may be set to have the cross-section elongated in the direction of gravity. In general, the electronic apparatuses are arranged in the direction of gravity. As long as the through opening, the ventilation opening and the auxiliary space are elongated in the direction of gravity, all the electronic apparatuses are allowed to equally enjoy the fresh air. All the electronic apparatuses can thus be reliably cooled.

The storage box may further comprise: a second auxiliary box-shaped enclosure connected to the box-shaped enclosure so as to close the second plane of the box-shaped enclosure, the second auxiliary box-shaped enclosure including a wall member and an outer wall in cooperation defining a second auxiliary space isolated from the storage space with the wall member of the second auxiliary box-shaped enclosure; a second through opening formed in the wall member of the second auxiliary box-shaped enclosure so as to spatially connect the storage space to the second auxiliary space; and a second ventilation opening formed in the outer wall of the second auxiliary space. The second auxiliary space bends between the second through opening and the second ventilation opening. The second plane of the box-shaped enclosure is closed with the second auxiliary box-shaped enclosure. The storage space is connected to the fresh air not only through the aforementioned path including the through opening, the auxiliary space and the ventilation opening but also through a path including the second through opening, the second auxiliary space and the second ventilation opening. The deadening wall or walls of the box-shaped enclosure serve to prevent the leakage of the sound during the operation of the electronic apparatus or apparatuses. The operating sound also leaks out of the ventilation opening at the first plane of the box-shaped enclosure as described above. Likewise, the operating sound leaks out through the second through opening at the second plane of the box-shaped enclosure into the second auxiliary space. The operating sound then leaks out of the second ventilation opening. Since the path of the sound transmission is significantly restricted, the leakage of the sound is reduced. Noise is further reduced. In particular, the second auxiliary space bends between the second through opening and the second ventilation opening. The operating sound leaking through the second through opening collides against the wall member of the second auxiliary box-shaped enclosure. The transmission of the sound is in this manner effectively suppressed. Noise is reliably reduced. Moreover, the storage box allows establishment of a flow passage for airflow at the first plane of the box-shaped enclosure based on the through opening, the auxiliary space and the ventilation opening. The storage box likewise allows establishment of a flow passage for airflow at the second plane based on the second through opening, the second auxiliary space and the second ventilation opening. The fresh air can reliably be introduced into the storage space. The electronic apparatus or apparatuses can thus effectively be cooled.

The second ventilation opening may be opened at the side of the second auxiliary space. Alternatively, the second ventilation opening may be opened at the top of the second auxiliary space. Otherwise, the second ventilation opening may be opened at the bottom of the second auxiliary space. The second ventilation opening may be placed at a position appropriately determined depending on the placement of the storage box.

The outer wall of the second auxiliary box-shaped enclosure may include: a first outer wall member extending in parallel with the wall member of the second auxiliary box-shaped enclosure; and second and third outer wall members opposed to each other, the second and third wall members connecting the wall member to the first outer wall member. The second through opening may extend along the edge defined between the wall member and the second outer wall member. The second ventilation opening may extend along the edge defined between the first outer wall member and the third outer wall member. The second ventilation opening is in this manner sufficiently distanced from the second through opening. The sound transmission is further reduced.

The second through opening may be a window opening elongated in the direction of gravity. Likewise, the second ventilation opening may be a window opening elongated in the direction of gravity. In addition, the second auxiliary space may be set to have the cross-section elongated in the direction of gravity. In general, the electronic apparatuses are arranged in the direction of gravity. As long as the second through opening, the second ventilation opening and the second auxiliary space are elongated in the direction of gravity, all the electronic apparatuses are allowed to equally enjoy the fresh air. All the electronic apparatuses can thus reliably be cooled.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
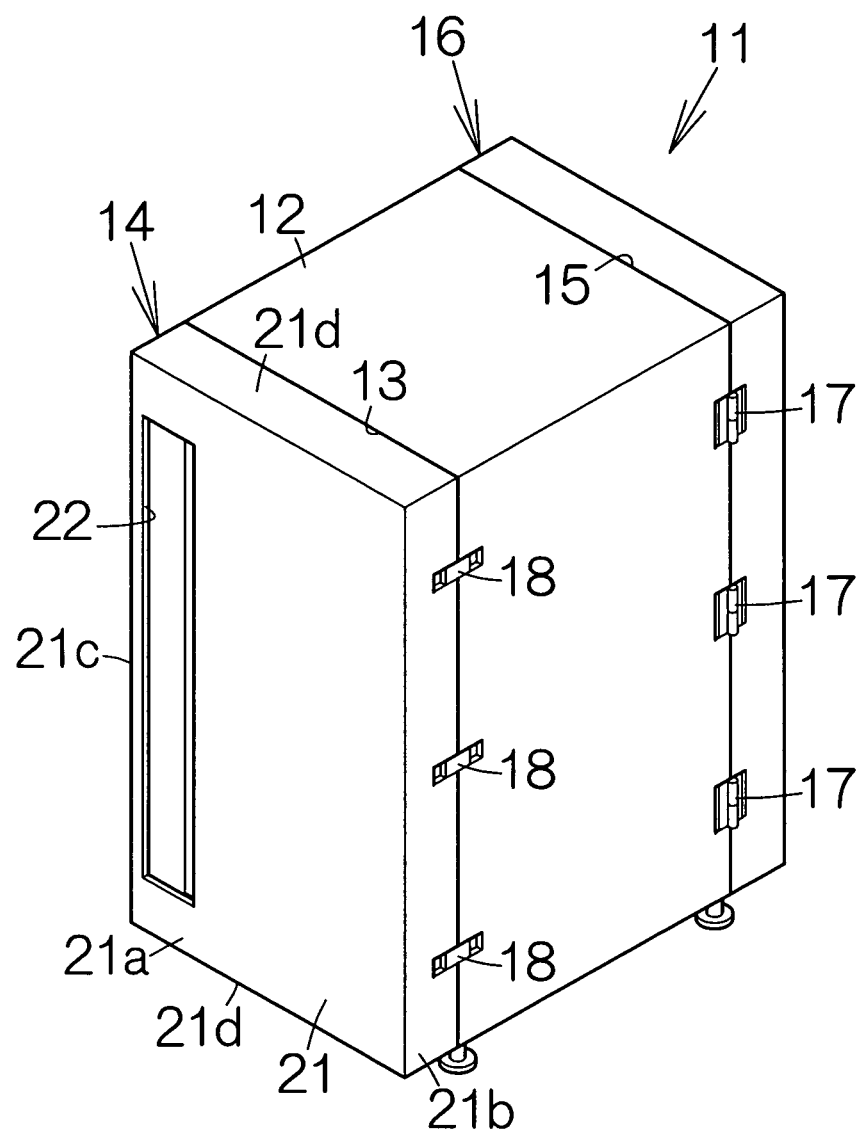
FIG. 1 is a perspective view schematically illustrating a storage box, for an electronic apparatus, according to a first embodiment of the present invention.

FIG. 1 schematically illustrates a storage box 11, for an electronic apparatus, according to a first embodiment of the present invention. The storage box 11 includes a box-shaped enclosure 12. A first door 14 is designed to close a first plane, namely a front surface 13 of the box-shaped enclosure 12. A second door 16 is designed to close a second plane, namely a back surface 15 of the box-shaped enclosure 12. The first door 14 and the second door 16 are coupled to the box-shaped enclosure 12 for relative swinging movement, namely for opening and closing operations. Hinges 17 may be utilized to couple the first and second doors 14, 16, for example. The first door 14 and the second door 16 are respectively allowed to swing around hinge pins of the hinges 17. The hinges 17 accept the attachment and detachment of the first door 14 and the second door 16 to and from the box-shaped enclosure 12. Latches 18 in combination with the hinges 17 serve to make the first door 14 and the second door 16 tightly contact with the box-shaped enclosure 12. The latches 18 prevent the first door 14 and the second door 16 from opening. Deadening walls are employed to form the box-shaped enclosure 12, the first door 14 and the second door 16.

The first door 14 includes a first auxiliary box-shaped enclosure 21. The first auxiliary box-shaped enclosure 21 includes a first outer wall member 21a extending in parallel with the front surface 13 of the box-shaped enclosure 12. Second and third outer wall members 21b, 21c are connected to the side edges of the first outer wall member 21a, respectively. The second and third outer wall members 21b, 21c are opposed to each other. Fourth outer wall members 21d, 21d are connected to the upper and lower edges of the first outer wall member 21a, respectively. The fourth outer wall members 21d, 21d are opposed to each other. As described later, the first outer wall member 21a, the second outer wall member 21b, the third outer wall member 21c and the fourth outer wall members 21d, 21d are combined together to define an auxiliary space in the form of a parallelepiped. A first ventilation opening 22 is formed in the first outer wall member 21a. The first ventilation opening 22 is a window opening elongated in the direction of gravity. The first ventilation opening 22 extends along the edge defined between the first outer wall member 21a and the third outer wall member 21c.

Figure 2:
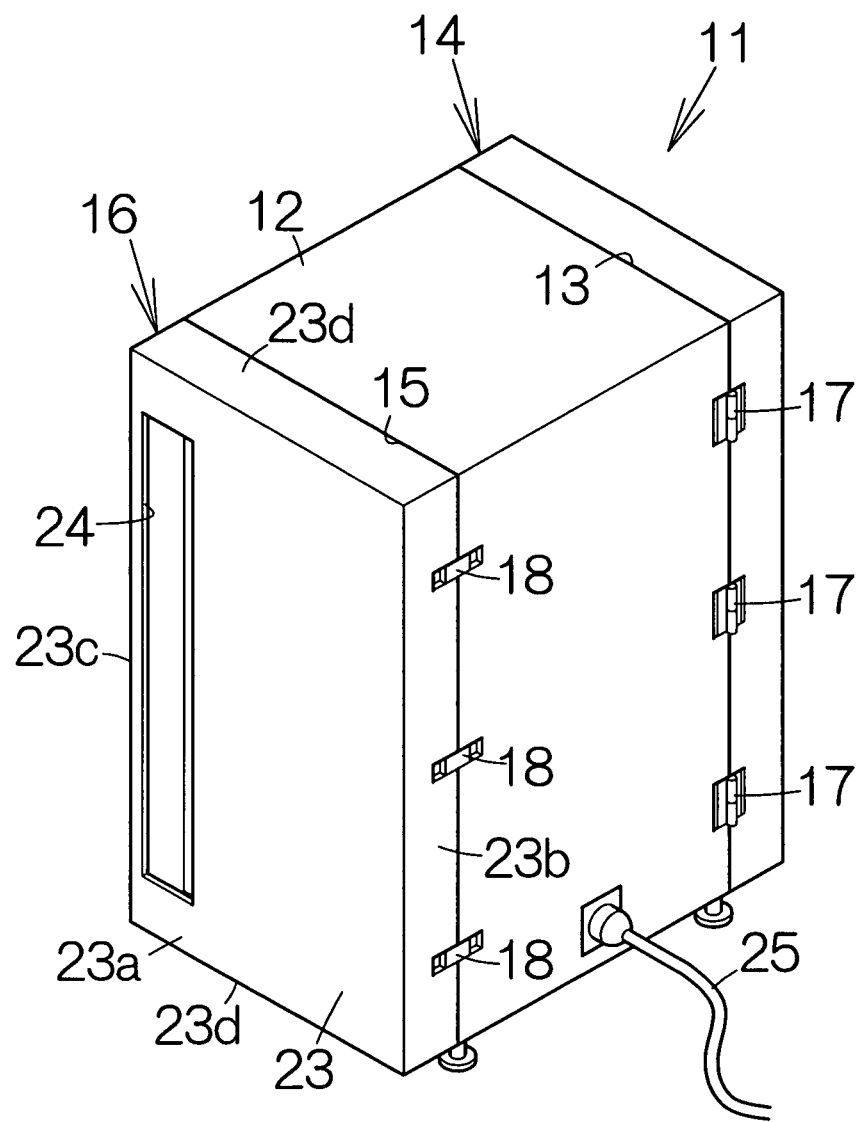
FIG. 2 is a perspective view schematically illustrating the storage box from the viewpoint opposite to that of FIG. 1.

As shown in FIG. 2, the second door 16 includes a second auxiliary box-shaped enclosure 23. The second auxiliary box-shaped enclosure 23 includes a first outer wall member 23a extending in parallel with the back surface 15 of the box-shaped enclosure 12. Second and third outer wall members 23b, 23c are connected to the side edges of the first outer wall member 23a, respectively. The second and third outer wall members 23b, 23c are opposed to each other. Fourth outer wall members 23d, 23d are connected to the upper and lower edges of the first outer wall member 23a, respectively. The fourth outer wall members 23d, 23d are opposed to each other. As described later, the first outer wall member 23a, the second outer wall member 23b, the third outer wall member 23c and the fourth outer wall members 23d, 23d are combined together to define an auxiliary space in the form of a parallelepiped. A second ventilation opening 24 is formed in the first outer wall member 23a. The second ventilation opening 24 is a window opening elongated in the direction of gravity. The second ventilation opening 24 extends along the edge defined between the first outer wall member 23a and the third outer wall member 23c.

A power supply cord 25 is connected to the side surface of the box-shaped enclosure 12. The power supply cord 25 is connected to an outlet, for example. Electric power is supplied to the box-shaped enclosure 12 through the power supply cord 25.

Figure 3:
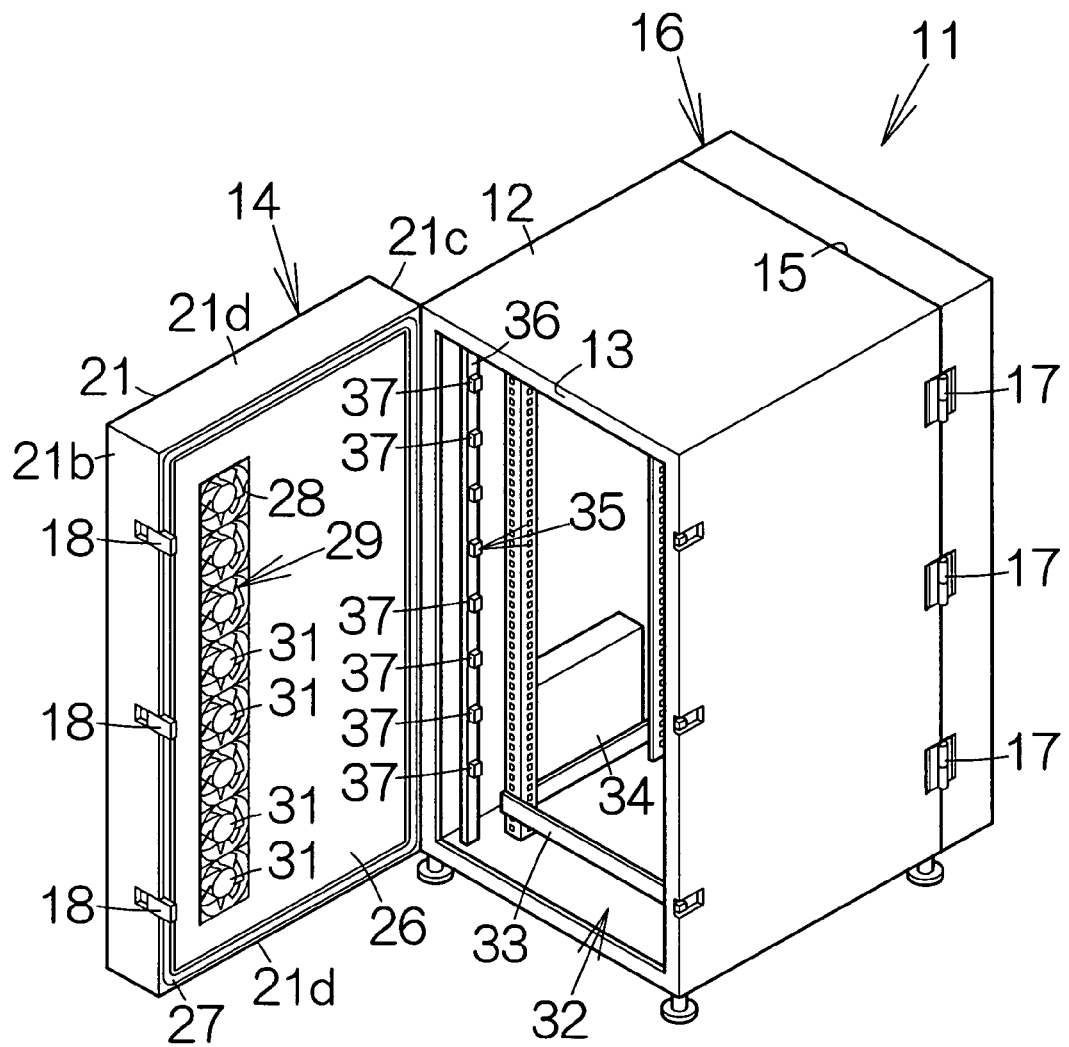
FIG. 3 is a perspective view schematically illustrating the storage box with a first door opened.

As shown in FIG. 3, the first door 14 includes a first deadening wall member 26. The first deadening wall member 26 closes the front surface 13 of the box-shaped enclosure 12. The outer periphery of the first deadening wall member 26 is connected to the second outer wall member 21b, the third outer wall member 21c and the fourth outer wall members 21d. When the first door 14 is closed, the first deadening wall member 26 extends along the front surface 13 of the box-shaped enclosure 12. A packing member 27 is attached to the first deadening wall member 26 without a gap along the outer periphery of the first deadening wall member 26. The packing member 27 may be made of rubber, for example. The packing member 27 will be described later in detail.

A first through opening 28 is formed in the first deadening wall member 26. The first through opening 28 is a window opening elongated in the direction of gravity. The first through opening 28 extends along the edge defined between the first deadening wall member 26 and the second outer wall member 21b. A first ventilating unit 29 is mounted in the first through opening 28. The first ventilating unit 29 includes eight first ventilators 31, for example. The individual first ventilator 31 may be an axial flow fan unit, for example. The axial flow fan unit allows blades to rotate around a rotation axis extending in the horizontal direction. The axial flow fan unit generates a horizontal airflow. The individual first ventilator 31 is fixed to the first deadening wall member 26. The individual first ventilator 31 is separately removable from the first deadening wall member 26. The first ventilating unit 29 has a performance to generate a predetermined amount of airflow. The first ventilators 31 may be arranged in the direction of gravity, for example.

A storage space 32 in the form of a parallelepiped is defined within the box-shaped enclosure 12 between the front surface 13 and the back surface 15. The box-shaped enclosure 12 opens at the front surface 13 and the back surface 15, for example. A rack 33 is placed within the storage space 32. The rack 33 is constructed as a so-called 19-inch rack. The rack 33 is designed to define a rack space for enclosing an electronic apparatus. A controller box 34 is placed at a position adjacent to the rack 33. A controller board is incorporated in the controller box 34 for controlling the operation of the first ventilators 31, for example. The controller board will be described later in detail.

A first thermal sensor set 35 is incorporated in the storage space 32. The first thermal sensor set 35 includes first thermal sensors 37 attached to a support post 36, extending in the direction of gravity, at predetermined intervals, for example. The support post 36 is placed between the first deadening wall member 26 and the rack space of the rack 33. Specifically, the support post 36 is placed outside the rack space at a position distanced from the first deadening wall member 26. The first thermal sensors 37 are arranged along the edge defined between the first deadening wall member 26 and the third outer wall member 21c. The first thermal sensors 37 are designed to detect the ambient temperature.

Figure 4:
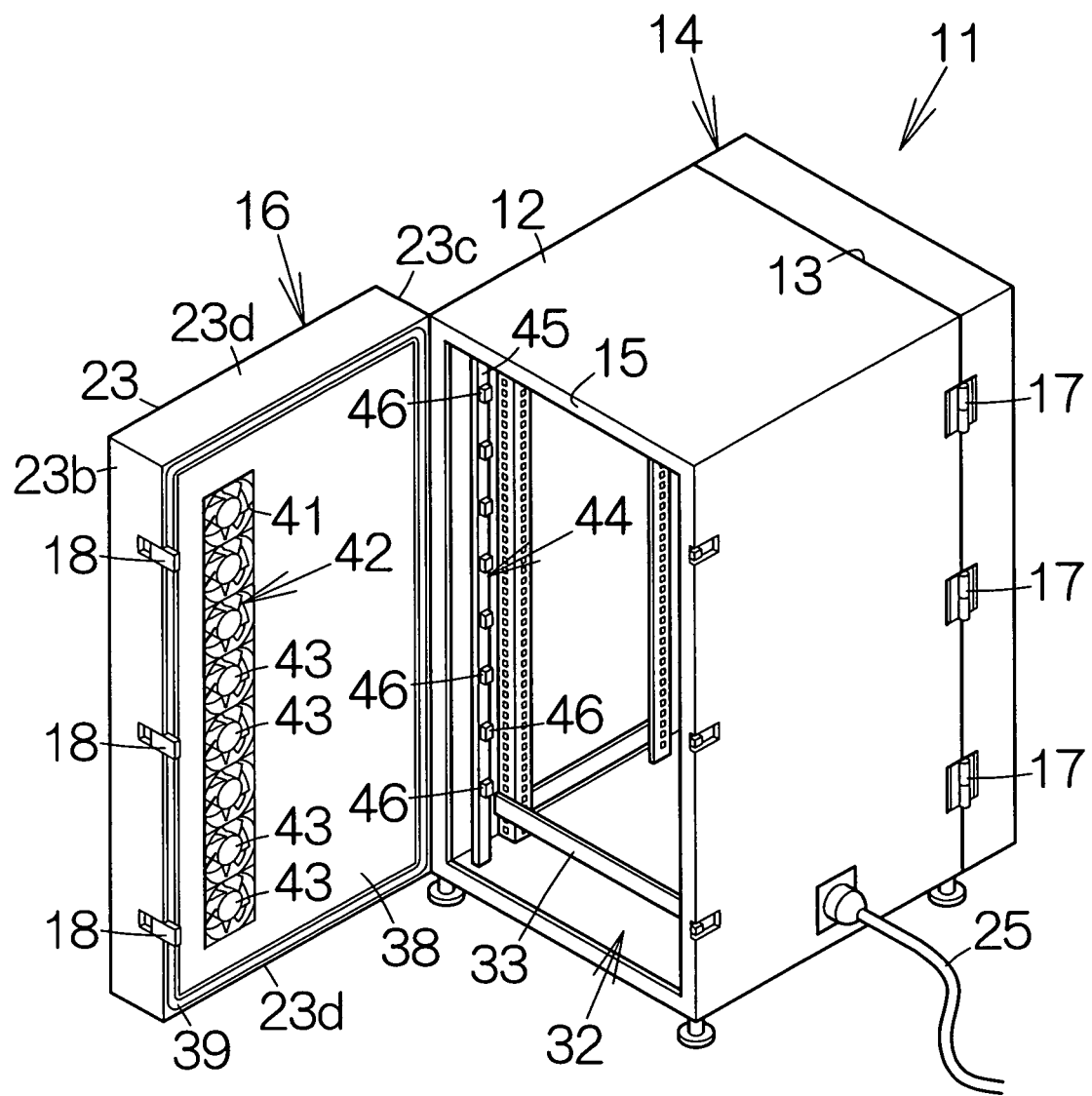
FIG. 4 is a perspective view schematically illustrating the storage box with a second door opened.

As shown in FIG. 4, the second door 16 includes a second deadening wall member 38. The second deadening wall member 38 closes the back surface 15 of the box-shaped enclosure 12. The outer periphery of the second deadening wall member 38 is connected to the second outer wall member 23b, the third outer wall member 23c and the fourth outer wall members 23d. When the second door 16 is closed, the second deadening wall member 38 extends along the back surface 15 of the box-shaped enclosure 12. A packing member 39 is attached to the second deadening wall member 38 without a gap along the outer periphery of the second deadening wall member 38. The packing member 39 may be made of rubber, for example.

A second through opening 41 is formed in the second deadening wall member 38. The second through opening 41 is a window opening elongated in the direction of gravity. The second through opening 41 extends along the edge defined between the second deadening wall member 38 and the second outer wall member 23b. A second ventilating unit 42 is mounted in the second through opening 41. The second ventilating unit 42 includes eight second ventilators 43, for example. The individual second ventilators 43 may be an axial flow fan unit, for example. The axial flow fan unit allows blades to rotate around a rotation axis extending in the horizontal direction. The axial flow fan unit generates a horizontal airflow. The individual second ventilators 43 are fixed to the second deadening wall member 38. The individual second ventilator 43 is separately removable from the second deadening wall member 38. The second ventilators 43 may be arranged in the direction of gravity, for example. The second ventilating unit 42 includes a set of ventilators identical to a set of ventilators incorporated in the first ventilating unit 29. The second ventilating unit 42 thus has a performance equivalent to that of the first ventilating unit 29.

A second thermal sensor set 44 is incorporated in the storage space 32. The second thermal sensor set 44 includes second thermal sensors 46 attached to a support post 45, extending in the direction of gravity, at predetermined intervals, for example. The support post 45 is placed between the second deadening wall member 38 and the rack space of the rack 33. Specifically, the support post 45 is placed outside the rack space at a position distanced from the second deadening wall member 38. The second thermal sensors 46 are arranged along the edge defined between the second deadening wall member 38 and the third outer wall member 23c. The second thermal sensors 46 are designed to detect the ambient temperature.

Figure 5:
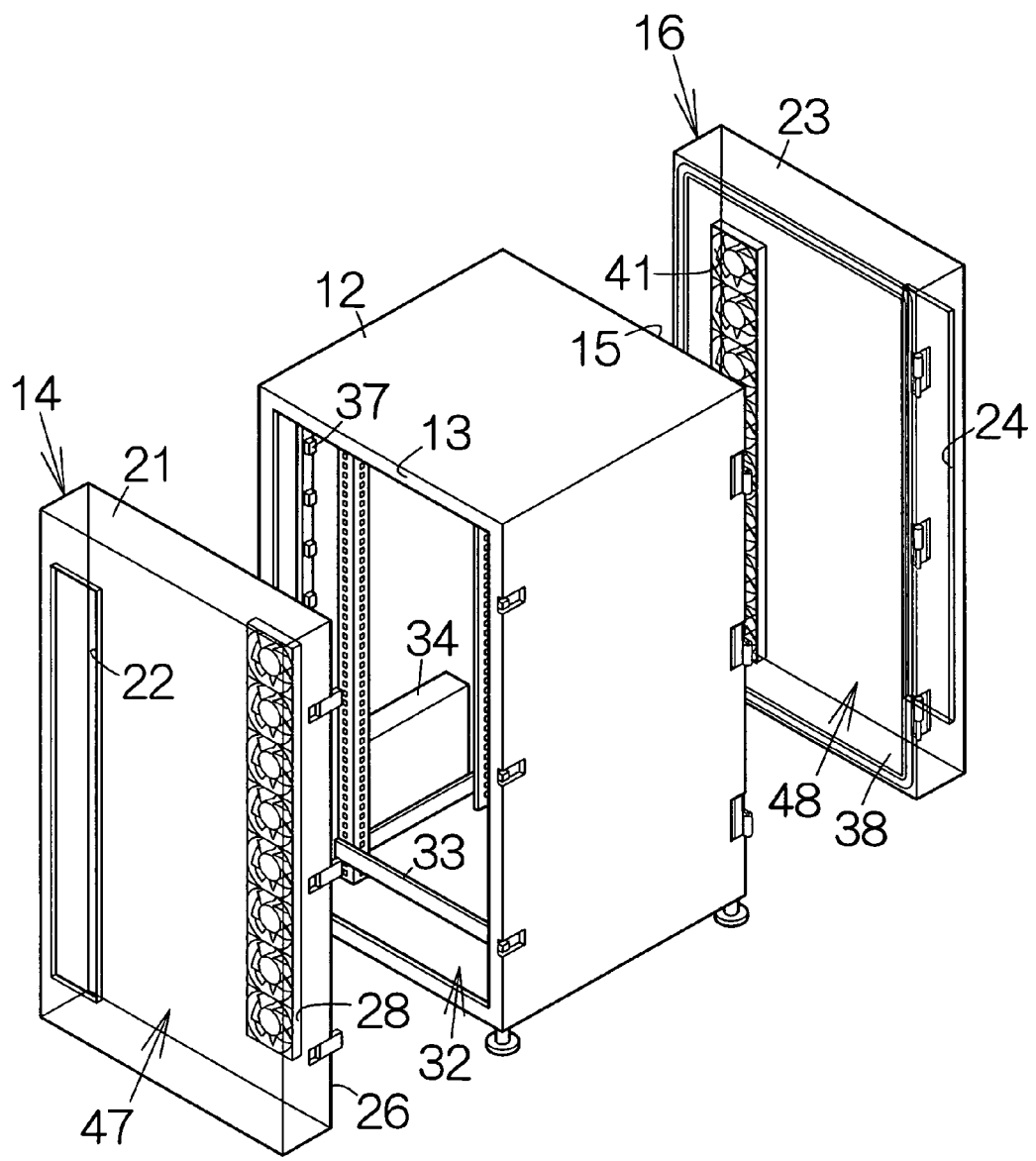
FIG. 5 is an exploded view schematically illustrating a storage space and first and second auxiliary spaces.

As shown in FIG. 5, the first auxiliary box-shaped enclosure 21 of the first door 14 defines a first auxiliary space 47 in the form of a parallelepiped. The first deadening wall member 26 serves to isolate the first auxiliary space 47 from the storage space 32. The first auxiliary space 47 has a cross-section elongated in the direction of gravity. The first auxiliary space 47 is spatially connected to the storage space 32 through the first through opening 28. The first auxiliary space 47 is spatially connected to the outer space through the first ventilation opening 22. The first ventilation opening 22 is formed on the first auxiliary box-shaped enclosure 21 at a position opposed to the first deadening wall member 26 off the first through opening 28. Specifically, the position of the first ventilation opening 22 is shifted from the position of the first through opening 28.

Likewise, the second auxiliary box-shaped enclosure 23 of the second door 16 defines a second auxiliary space 48 in the form of a parallelepiped. The second deadening wall member 38 serves to isolate the second auxiliary space 48 from the storage space 32. The second auxiliary space 48 has a cross-section elongated in the direction of gravity. The second auxiliary space 48 is spatially connected to the storage space 32 through the second through opening 41. The second auxiliary space 48 is spatially connected to the outer space through the second ventilation opening 24. The second ventilation opening 24 is formed in the second auxiliary box-shaped enclosure 23 at a position opposed to the second deadening wall member 38 off the second through opening 41. Specifically, the position of the second ventilation opening 24 is shifted from the position of the second through opening 41.

Figure 6:
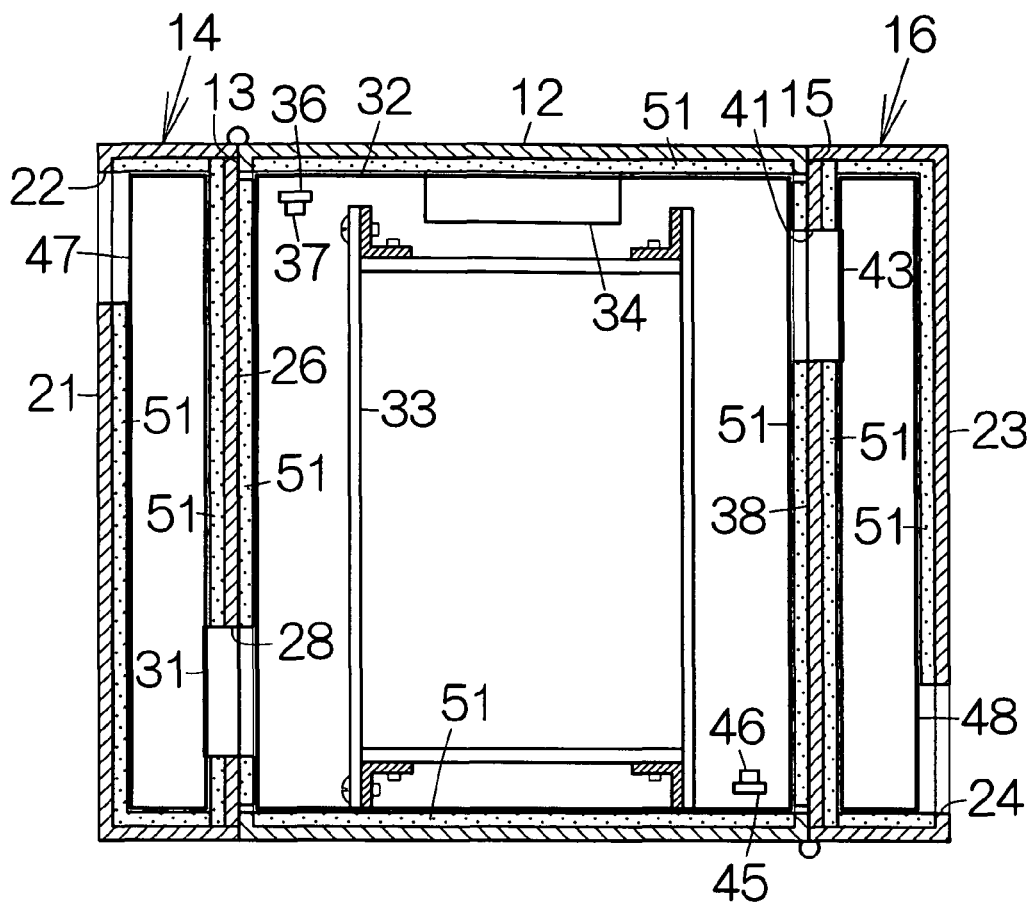
FIG. 6 is a sectional view schematically illustrating the inner structure of the storage box according to the first embodiment of the present invention.

As shown in FIG. 6, the box-shaped enclosure 12, the first auxiliary box-shaped enclosure 21, the first deadening wall member 26, the second auxiliary box-shaped enclosure 23 and the second deadening wall member 38 are made of a deadening panel or panels or sound insulating material. The sound insulating material allows insulation of sound. A steel plate of a considerable thickness may be employed as the sound insulating material, for example. An increased thickness of the steel plate results in an enhanced rigidity of the steel plate. The enhanced rigidity enables a higher performance of insulation. An acoustic material 51 of a predetermined thickness is attached to the inner surface of the box-shaped enclosure 12, the inner surface of the first auxiliary box-shaped enclosure 21, the front and back surfaces of the first deadening wall member 26, the inner surface of the second auxiliary box-shaped enclosure 23, and the front and back surfaces of the second deadening wall member 38. The acoustic material 51 is capable of absorbing sound. An urethane resin, a glass wool, a rock wool, a nonwoven fabric, or the like, may be employed as the acoustic material 51.

The first auxiliary space 47 extends from the first through opening 28 to the first ventilation opening 22. The first auxiliary space 47 bends between the first through opening 28 and the first ventilation opening 22. The first ventilation opening 22 is formed on the first auxiliary box-shaped enclosure 21 at a position farthest from the first through opening 28. A distance between the first ventilation opening 22 and the first through opening 28 may be set at 0.25 [m] or larger. Likewise, the second auxiliary space 48 extends from the second through opening 41 to the second ventilation opening 24. The second auxiliary space 48 bends between the second through opening 41 and the second ventilation opening 24. The second ventilation opening 24 is formed on the second auxiliary box-shaped enclosure 23 at a position farthest from the second through opening 41. A distance between the second ventilation opening 24 and the second through opening 41 may be set at 0.25 [m] or larger. A flow passage for airflow is established in the storage box 11 based on the first ventilation opening 22, the first auxiliary space 47, the first through opening 28, the storage space 32, the second through opening 41 and the second ventilation opening 24.

Figure 7:
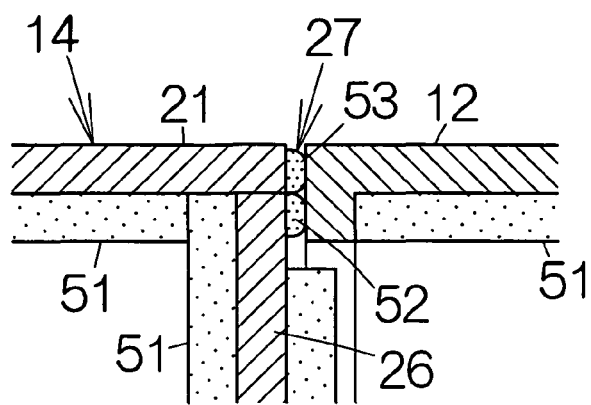
FIG. 7 is an enlarged partial sectional view schematically illustrating packing members according to a specific example.

As shown in FIG. 7, the packing member 27 includes a first elastic packing 52 and a second elastic packing 53, both attached to the first door 14 to surround the storage space 32. The second elastic packing 53 is attached to the first door 14 outside the first elastic packing 52. Alternatively, both of the first elastic packing 52 and the second elastic packing 53 may be attached to the box-shaped enclosure 12. Likewise, one of the first elastic packing 52 and the second elastic packing 53 may be attached to the first door 14 while the other of the first elastic packing 52 and the second elastic packing 53 is attached to the box-shaped enclosure 12. It should be noted that the packing member 39 has the structure identical to that of the packing member 27.

When the first door 14 or the second door 16 is closed, the first elastic packing 52 and the second elastic packing 53 are interposed between the box-shaped enclosure 12 and the first door 14 or the second door 16. The first elastic packing 52 and the second elastic packing 53 are tightly held to elastically deform between the box-shaped enclosure 12 and the first door 14 or the second door 16. The first elastic packing 52 and the second elastic packing 53 in this manner serve to eliminate a gap or gaps between the box-shaped enclosure 12 and the first door 14 or the second door 16 around the storage space 32 over the entire length.

Figure 8:
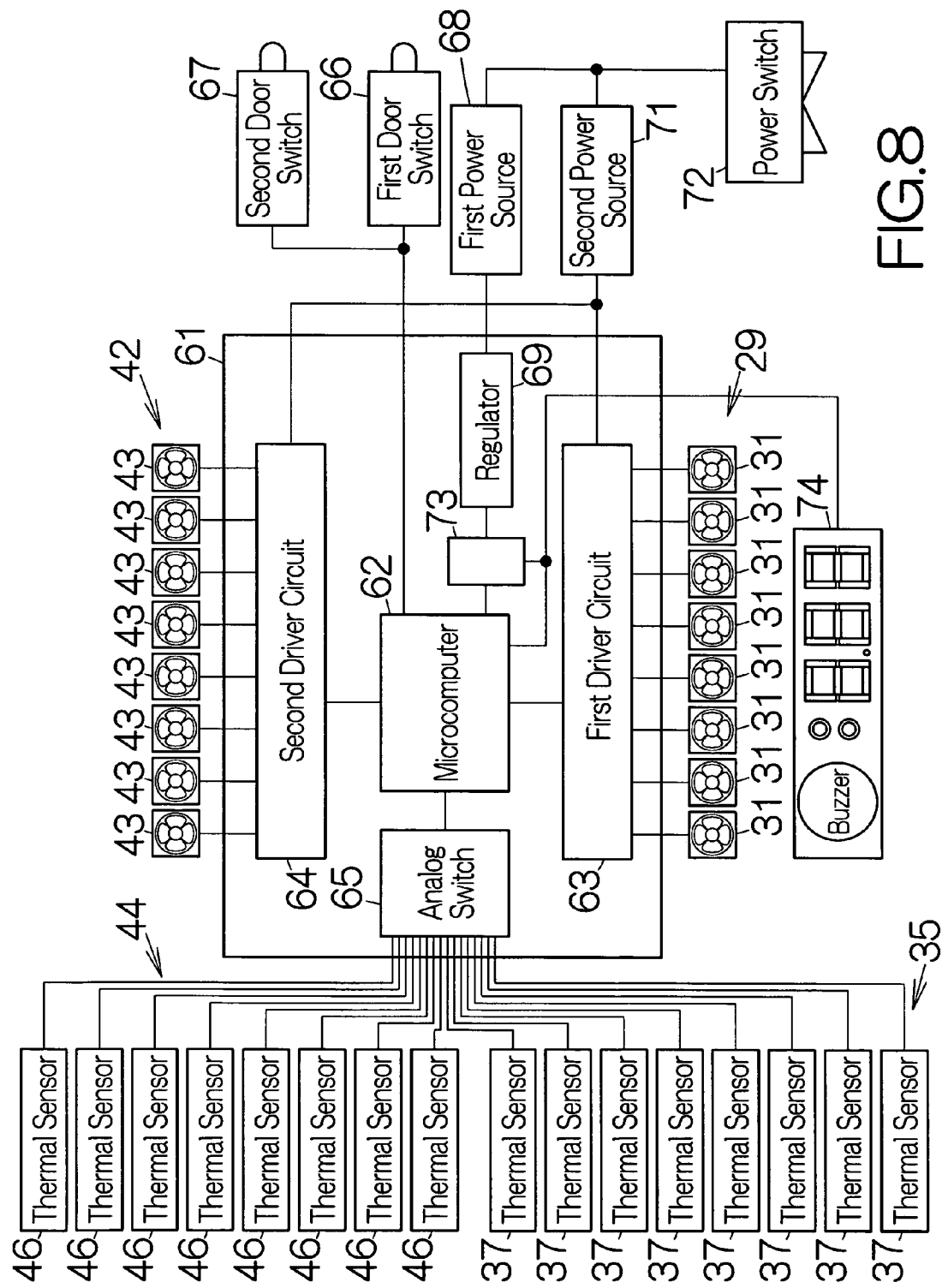
FIG. 8 is block diagram showing a control system of the present invention.

FIG. 8 illustrates a control system according to the present invention. The controller board 61 is incorporated in the controller box 34 as described above. A controller circuit, namely a microcomputer 62, is mounted on the controller board 61. The microcomputer 62 is designed to execute processing based on a program stored in an embedded memory. The microcomputer 62 reads out required data out of the embedded memory when the microcomputer 62 executes processing.

A first driver circuit 63 is mounted on the controller board 61. The first driver circuit 63 is connected to the individual first ventilators 31. The first driver circuit 63 is designed to control the on/off of the individual first ventilators 31 and the revolution speed of the individual first ventilators 31 in accordance with the instructions from the microcomputer 62. Voltage is applied to the individual first ventilators 31 from the first driver circuit 63 to control the on/off and the revolution speed. The first ventilators 31 are allowed to perform to establish an equalized flow rate of the airflow based on the control, for example. The microcomputer 62 is capable of monitoring the status of the individual first ventilators 31 based on the operation of the first driver circuit 63.

A second driver circuit 64 is likewise mounted on the controller board 61. The second driver circuit 64 is connected to the individual second ventilators 43. The second driver circuit 64 is designed to control the on/off of the individual second ventilators 43 and the revolution speed of the individual second ventilators 43 in accordance with the instructions from the microcomputer 62. Voltage is applied to the individual second ventilators 43 from the second driver circuit 64 to control the on/off and the revolution speed. The second ventilators 43 are allowed to perform to establish an equalized flow rate of the airflow based on the control, for example. The microcomputer 62 is capable of monitoring the status of the individual second ventilators 43 based on the operation of the second driver circuit 64.

The aforementioned first and second thermal sensors 37, 46 are connected to the microcomputer 62. The individual thermal sensors 37, 46 are designed to output a sensor signal to the microcomputer 62. The sensor signal serves to represent the temperature information specifying a temperature detected at the individual thermal sensor 37, 46. The microcomputer 62 in this manner obtains the temperature information for the individual thermal sensors 37, 46. An analog switch 65 is interposed between the microcomputer 62 and the first and second thermal sensors 37, 46 for the collection of the temperature information. The analog switch 65 is utilized to connect the microcomputer 62 to the thermal sensors 37, 46 in order. The sensor signals of the thermal sensors 37, 46 are in this manner distinguished from each other. The microcomputer 62 calculates the average of the temperature information supplied from the first thermal sensor set 35 and the average of the temperature information supplied from the second thermal sensor set 44. A difference is then calculated between the averages.

A first door switch 66 and a second door switch 67 are connected to the microcomputer 62. The first door switch 66 is placed between the box-shaped enclosure 12 and the first door 14, for example. The first door switch 66 is designed to detect the opening of the first door 14. The first door switch 66 outputs a first detection signal to the microcomputer 62. The first detection signal represents detection information specifying the opening of the first door 14. The first door switch 66 may be a contact switch which allows electric connection when the first door 14 is closed. Likewise, the second door switch 67 is placed between the box-shaped enclosure 12 and the second door 16, for example. The second door switch 67 is designed to detect the opening of the second door 16. The second door switch 67 outputs a second detection signal to the microcomputer 62. The second detection signal represents detection information specifying the opening of the second door 16. The second door switch 67 may be a contact switch which allows electrical connection when the second door 16 is closed.

A first power source 68 is connected to the microcomputer 62. Alternating voltage is supplied to the first power source 68. The first power source 68 is designed to convert the alternating voltage to direct voltage. A regulator 69 is interposed between the microcomputer 62 and the first power source 68. The regulator 69 may be mounted on the controller board 61, for example. The regulator 69 is designed to convert the direct voltage from the first power source 68 to the voltage of a predetermined voltage level. The voltage of a desired voltage level is in this manner applied to the microcomputer. Likewise, a second power source 71 is connected to the first driver circuit 63 and the second driver circuit 64. Alternating voltage is supplied to the second power source 71. The second power source 71 is designed to convert the alternating voltage to direct voltage. Voltage of a desired voltage level is in this manner applied to the first driver circuit 63 and the second driver circuit 64.

A power switch 72 is connected to the first and second power sources 68, 71. Electric power is supplied to the power switch 72 through the aforementioned power supply cord 25. When the power switch 72 is opened, the first and second power sources 68, 71 stop receiving the electric power. When the power switch 72 is closed, the electric power is supplied to the first and second power sources 68, 71.

An error monitoring circuit 73 is interposed between the microcomputer 62 and the regulator 69. The error monitoring circuit 73 is designed to detect the voltage supplied from the regulator 69 to the microcomputer 62. The error monitoring circuit 73 monitors the output signal from the microcomputer 62 for a predetermined period after the start of the supply of the voltage. If the error monitoring circuit 73 receives no output signal from the microcomputer 62 in the predetermined period, the error monitoring circuit 73 detects a malfunction of the microcomputer 62. The microcomputer 62 is set to execute a predetermined initial operation. The initial operation forces the microcomputer 62 to output the aforementioned output signal to the error monitoring circuit 73 immediately after the microcomputer 62 starts receiving voltage.

A display device 74 is connected to the microcomputer 62 and the error monitoring circuit 73. The display device 74 may be placed on the outer surface of the box-shaped enclosure 12 or the first door 14, for example. The microcomputer 62 outputs a predetermined display signal based on the status of the aforementioned sensor signals, the status of the first and second driver circuits 63, 64, and the first and second detection signals. A predetermined display is displayed on the display device 74 based on such a display signal. Likewise, the error monitoring circuit 73 outputs a predetermined display signal to the display device 74 in response to the detection of a malfunction of the microcomputer 62. Here, alphanumeric characters may be displayed on the display device 74. A specific meaning may be assigned to an alphanumeric string beforehand. The display device 74 serves to reliably notify the user of the status of the first and second ventilating units 29, 42, for example. The user is allowed to reliably become aware of the status of the first and second ventilating units 29, 42.

Figure 9:
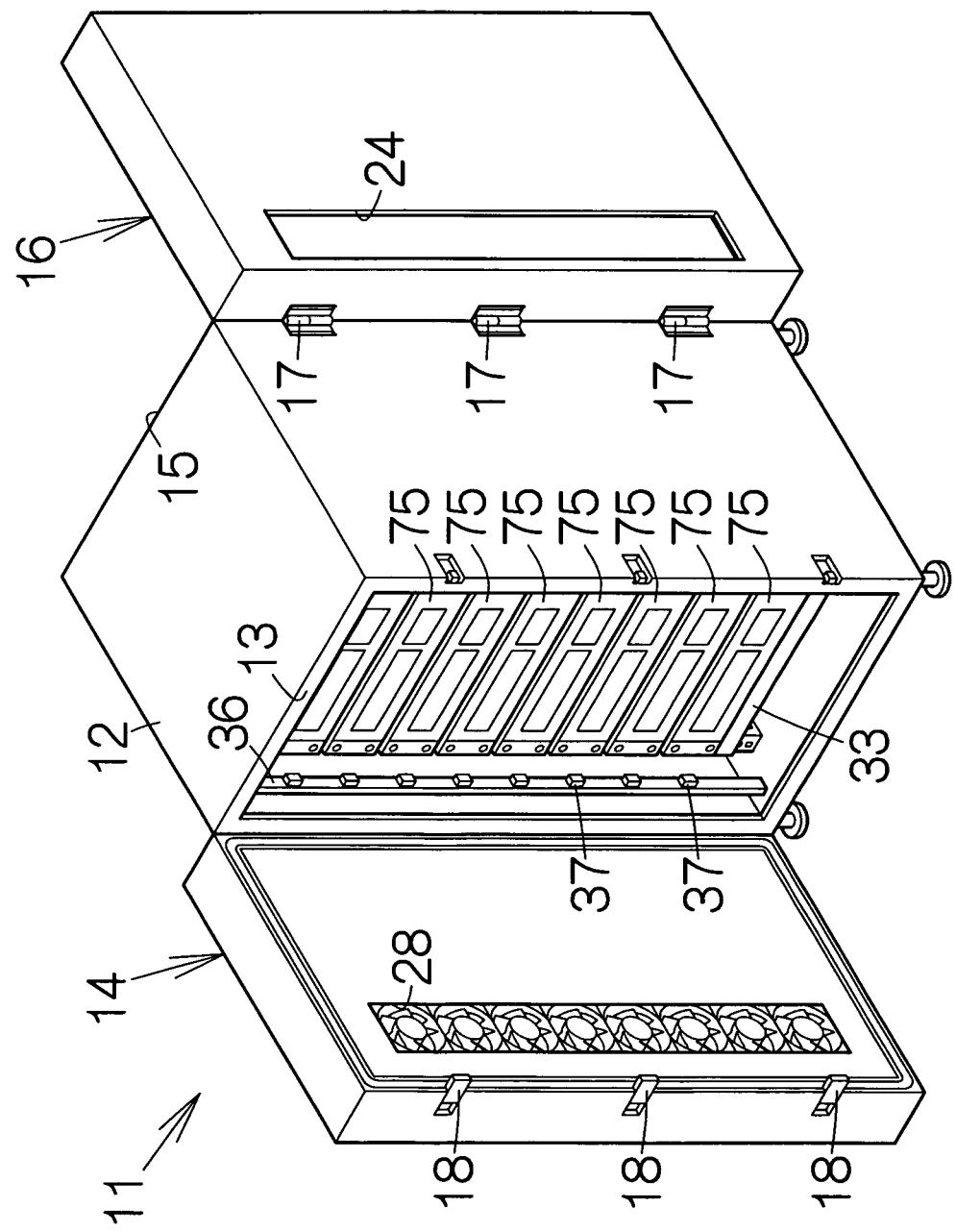
FIG. 9 is a perspective view schematically illustrating the storage box with electronic apparatuses mounted.

Now, as shown in FIG. 9, assume that the server computers 75 of a rack mount type are mounted on the rack 33 within the storage box 11, for example. The power cord of the individual server computer 75 is connected to the aforementioned power supply cord 25, for example. Electric power is supplied to the server computers 75 through the power supply cord 25. The first door 14 and the second door 16 are opened during the setting and connection of the server computers 75. When the setting and connection have been completed, the first door 14 and second door 16 are closed. The latches 18 serve to urge the first door 14 and the second door 16 against the box-shaped enclosure 12. The first elastic packing 52 and the second elastic packing 53 serve to eliminate a gap or gaps between the box-shaped enclosure 12 and the first door 14 and between the box-shaped enclosure 12 and the second door 16 around the storage space 32 over the entire length.

Figure 10:
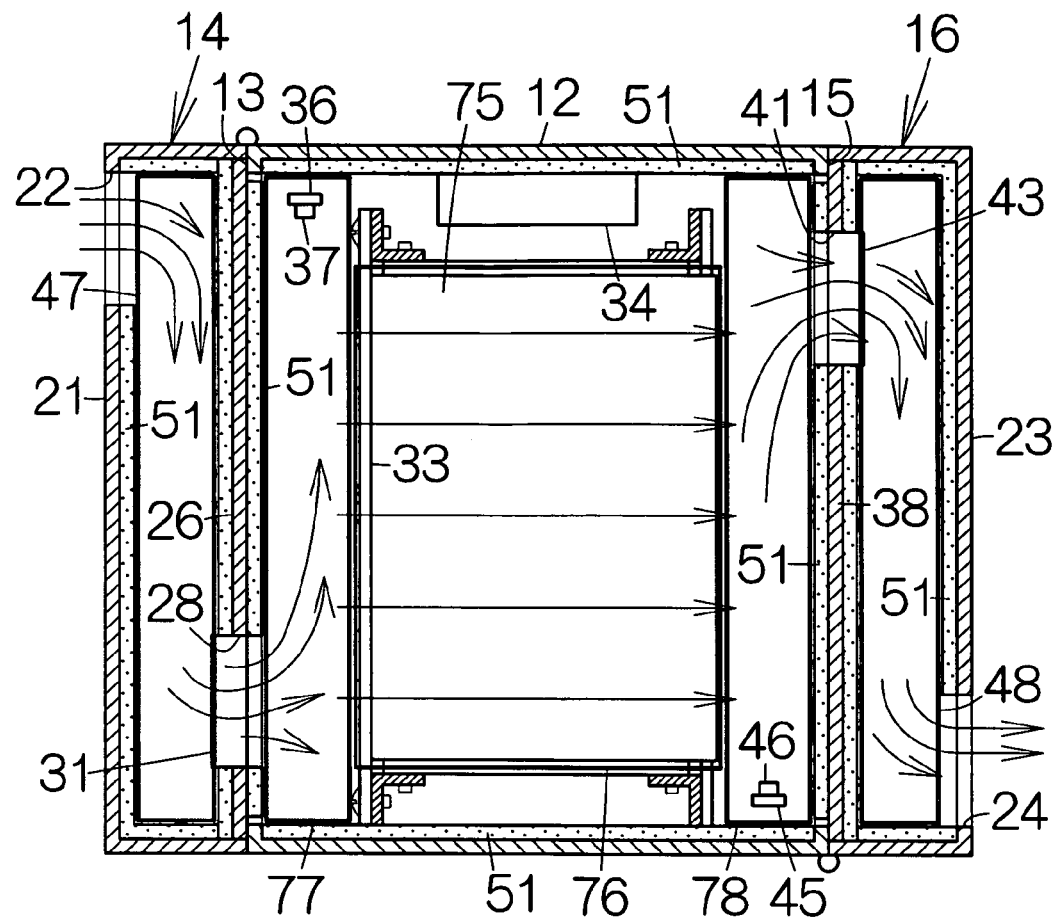
FIG. 10 is a sectional view schematically illustrating airflow generated in the storage box in operation.

As shown in FIG. 10, the individual server computers 75 are placed within a rack space 76. In this case, a predetermined space is maintained between front panels of the server computers 75 and the first deadening wall member 26. A front space 77 is thus formed between the rack space 76 and the first deadening wall member 26. Likewise, a predetermined space is maintained between the rear panels of the server computers 75 and the second deadening wall member 38. A rear space 78 is thus formed between the rack space 76 and the second deadening wall member 38.

A cooling fan or fans operate within the individual server computer 75 depending on the inner temperature of the server computer 75. As shown in FIG. 10, the cooling fan serves to generate airflow in the horizontal direction from the front space 77 toward the rear space 78 within the server computer 75. In this case, the cooling fan or fans make sound or noise during the operation. The box-shaped enclosure 12 and the first and second deadening wall members 26, 38 enables insulation of the sound. Simultaneously, the acoustic material 51 absorbs the sound within the box-shaped enclosure 12 and the first and second deadening wall members 26, 38. The sound leaks out only from the first through opening 28 and the second through opening 41. The sound is then directed from the first and second auxiliary spaces 47, 48 toward the first and second ventilation openings 22, 24. Since the acoustic material 51 surrounds the first and second auxiliary spaces 47, 48, the sound is sufficiently absorbed within the first and second auxiliary spaces 47, 48. In particular, the first and second auxiliary spaces 47, 48 are respectively designed to bend between the first and second through openings 28, 41 and the first and second ventilation openings 22, 24. The sound leaking from the first and second through openings 28, 41 collides against the first outer wall members 21a, 23a of the first and second auxiliary box-shaped enclosures 21, 23, namely the acoustic material 51. The transmission of the sound is effectively suppressed in this manner. The leakage of the sound is thus minimized. Noise is reliably reduced.

When the power switch 72 is turned on, electric power is supplied from the first power source 68 to the microcomputer 62. The microcomputer 62 receives a sensor signal output from the individual thermal sensor 47, 46. The microcomputer 62 calculates the average of the temperature of the first thermal sensors 37 in the first thermal sensor set 35 based on the sensor signals. The microcomputer 62 likewise calculates the average of the temperature of the second thermal sensors 46 in the second thermal sensor set 44 based on the sensor signals. The microcomputer 62 operates to subtract the average of the temperature for the first thermal sensor set 35 from the average of the temperature for the second thermal sensor set 44. The microcomputer 62 in this manner obtains a difference in temperature between the introduced air and the discharged air.

If the difference in temperature falls within a predetermined range (2 degrees, for example), the microcomputer 62 outputs a control signal to the first and second driver circuits 63, 64 to stop the operation of the first and second ventilating units 29, 42. In this case, the microcomputer 62 decides to deny a rise in the temperature in the server computers 75. If the difference in the temperature exceeds the predetermined range, the microcomputer 62 decides to determine a rise in the temperature in the server computers 75. The microcomputer 62 outputs a control signal to the first and second driver circuits 63, 64 to drive the first and second ventilating units 29, 42. The first and second driver circuits 63, 64 supply electric power to the first and second ventilators 31, 43, respectively. The first and second ventilators 31, 43 generate airflow in the horizontal direction. As shown in FIG. 10, fresh air is introduced into the first auxiliary space 47 through the first ventilation opening 22. The air in the first auxiliary space 47 is then directed into the front space 77 through the first through opening 28. The server computers 75 are thus always allowed to enjoy the fresh air.

The air is discharged from the server computers 75 into the rear space 78. The operation of the second ventilating unit 42 makes the discharged air flow into the second auxiliary space 48. The air is then discharged through the second ventilation opening 24. The hot air is in this manner discharged. The operation of the first and second ventilating units 29, 42 allows a sufficient replacement of air in the storage space 32. This results in a reliable prevention of an excessive rise in the temperature of the server computers 75. The server computers 75 can efficiently be cooled. In addition, the first and second through openings 28, 41 are window openings elongated in the direction of gravity. The server computers 75 are arranged on the rack 33 in the direction of the gravity. All the server computers 75 are allowed to equally enjoy the fresh air. All the server computers 75 can reliably be cooled.

The microcomputer 62 operates to change the flow rate of the airflow from the first and second ventilating unit 29, 42 depending on the difference in temperature. In this case, the microcomputer 62 operates to change the value of the voltage output from the first and second driver circuits 63, 64 depending on the difference in temperature. An increased difference in temperature may induce an increase in the voltage supplied to the individual ventilators 31, 43. Here, the flow rate of the airflow of the first ventilating unit 29 is set equal to that of the second ventilating unit 42. The first ventilators 31 may have a uniform flow rate of the airflow in the first ventilating unit 29. Likewise, the second ventilating unit 42 may have a uniform flow rate of the airflow in the second ventilating unit 42. The individual ventilators 31, 43 may receive electric power of an equal voltage value. It should be noted that the flow rate of the first ventilating unit 29 may be different from that of the second ventilating unit 42. Different flow rates may be set for the individual ventilators 31, 43. In any case, generation of swirl is preferably avoided in the storage space 32. The generation of swirl leads to an increased noise.

The microcomputer 62 is designed to monitor the first door switch 66 and the second door switch 67 during the control on the operation of the first and second ventilating unit 29, 42. When the microcomputer 62 receives a first detection signal from the first door switch 66, the microcomputer 62 outputs a control signal to the first driver circuit 63 to stop the operation of the first ventilating unit 29. The operation of the first ventilating unit 29 is in this manner stopped when the first door 14 is opened. When the microcomputer 62 receives a second detection signal from the second door switch 67, the microcomputer 62 outputs a control signal to the second driver circuit 64 to stop the operation of the second ventilating unit 42. The operation of the second ventilating unit 42 is in this manner stopped when the second door 16 is opened. Alternatively, the microcomputer 62 may output a control signal to stop the operation of the first and second ventilating units 29, 42 in response to the reception of one of the first and second detection signals.

The first door 14 and the second door 16 are removably coupled to the box-shaped enclosure 12 in the storage box 11. The first door 14 and the second door 16 are removed in a facilitated manner. The maintenance of the server computers 75 can be realized within the box-shaped enclosure 12 in a facilitated manner. The first door 14 including the first auxiliary box-shaped enclosure 21 and the first deadening wall member 26 and the second door 16 including the second auxiliary box-shaped enclosure 23 and the second deadening wall member 38 can be replaced in a facilitated manner.

The second ventilating unit 42 includes a ventilator set identical to a ventilator set incorporated in the first ventilating unit 29. The opening area of the second through opening 41 is thus set equal to the opening area for the first through opening 28. This results in minimization of the opening areas in the first and second deadening wall members 26, 38. In addition, the performance of the second ventilating unit 42 is set equal to the performance of the first ventilating unit 29. Slack of airflow can be avoided in the storage space 32. No swirl is generated in the storage space 32.

The first and second thermal sensors 37, 46 are designed to detect the temperature of the air within the storage space 32. The microcomputer 62 is designed to control the operation of the first and second ventilating units 29, 42 based on the detected temperature of the air. The flow rate of the first and second ventilating units 29, 42 is determined depending on the detected temperature of the air. The fresh air of an appropriate amount can thus always be introduced into the storage space 32. The server computers 75 are efficiently cooled.

The first through opening 28 is designed to extend along the edge defined between first deadening wall member 26 and the second outer wall member 21b, for example. The first thermal sensors 37 are arranged along the edge defined between the first deadening wall member 26 and the third outer wall member 21c. Fresh air from the first through opening 28 hardly reaches the edge between the first deadening wall member 26 and the third outer wall member 21c. The temperature can thus easily rise at a position near the edge between the first deadening wall member 26 and the third outer wall member 21c. As long as the temperature is detected at such a position, it is possible to reliably prevent the server computers 75 from an excessive rise in temperature. This advantage is also applicable to the combination of the second through opening 41 and the second thermal sensors.

The opening area of the first ventilation opening 22 may preferably be set at one twentieth or larger the area of the front surface 13 of the box-shaped enclosure 12 in the storage box 11. The inventors have observed the relationship between the pressure loss and the ratio of the opening area of the first ventilation opening 22 to the entire area of the front surface 13. A computer simulation was employed for the observation. The opening area was changed relative to the entire area of the front surface 13 in the computer simulation. Airflow of 0.5

Figure 11:
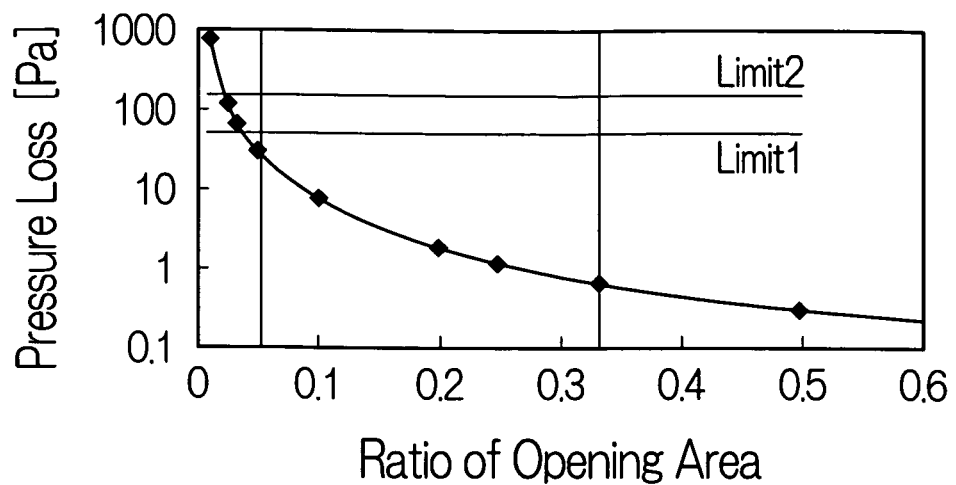
FIG. 11 is a graph showing the relationship between pressure loss and the ratio of an opening area.

[m/s] was uniformly set to flow within the front space 77 from the first deadening wall member 26 toward the rack space 76. As shown in FIG. 11, it has been confirmed that increase in the ratio of the opening area leads to reduction in the pressure loss. When the ratio of the opening area is reduced below one twentieth, the airflow of 10 [m/s] or larger is generated at the first ventilation opening 22. In general, when the speed of the airflow exceeds 10 [m/s], the sound of the airflow is significantly increased. This results in increase in noise. Accordingly, as long as the ratio of the opening area is set at one twentieth or larger, noise is significantly reduced. In FIG. 11, "Limit1" represents the limit of airflow for a square axial flow fan unit of approximately 120 [mm] to 140 [mm] square. "Limit2" represents the limit of airflow for a circular axial fan unit having the diameter of 200 [mm] approximately. Once the pressure loss exceeds the limit of airflow, no airflow is generated even during the operation of the axial fan unit. The opening area of the second ventilation opening 24 may be determined at a ratio to the entire area of the back surface 15 in a similar manner as the ratio of the opening area for the first ventilation opening 22.

Figure 12:
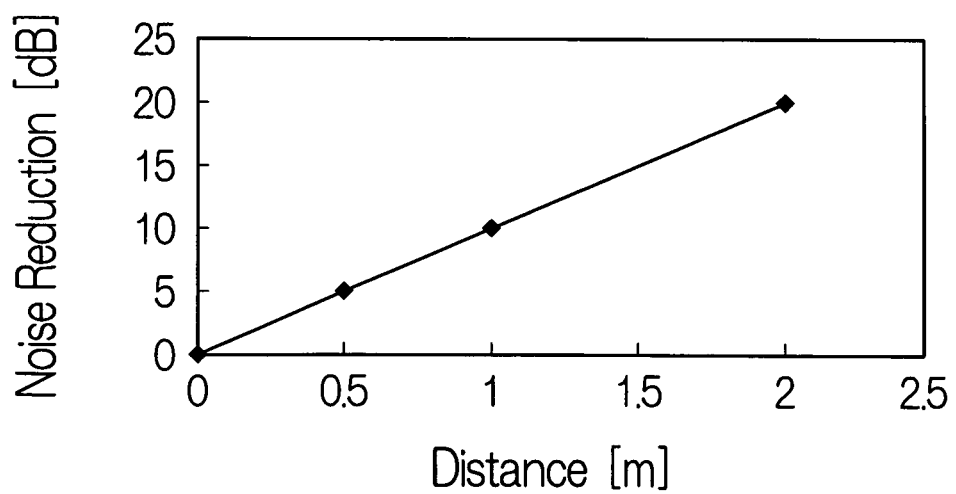
FIG. 12 is a graph showing the relationship between reduction in noise and the distance between a ventilation opening and a rack space.

The distance is preferably set larger than 0.4 [m] between the first ventilation opening 22 and the rack space 76 in the storage box 11. The inventors have observed the relationship between such a distance and reduction in noise. A computer simulation was employed for the observation. It has been confirmed that the acoustic material 51 is effective for reducing noise within the first auxiliary space 47 in the computer simulation. As shown in FIG. 12, noise was reduced by 10 [dB] per 1 [m]. Specifically, it has been confirmed that noise is reduced by 10 [dB] during transmission from the rack space 76 to the first ventilation opening 22 when the distance is set at 1 [m] between the rack space 76 and the first ventilation opening 22, for example. In general, when noise is reduced by at least 4 [dB], human beings realize reduction in the noise. Accordingly, if the distance is set at 0.4 [m] between the first ventilation opening 22 and the rack space 76, the user can realize reduction in the noise.

Figure 13:
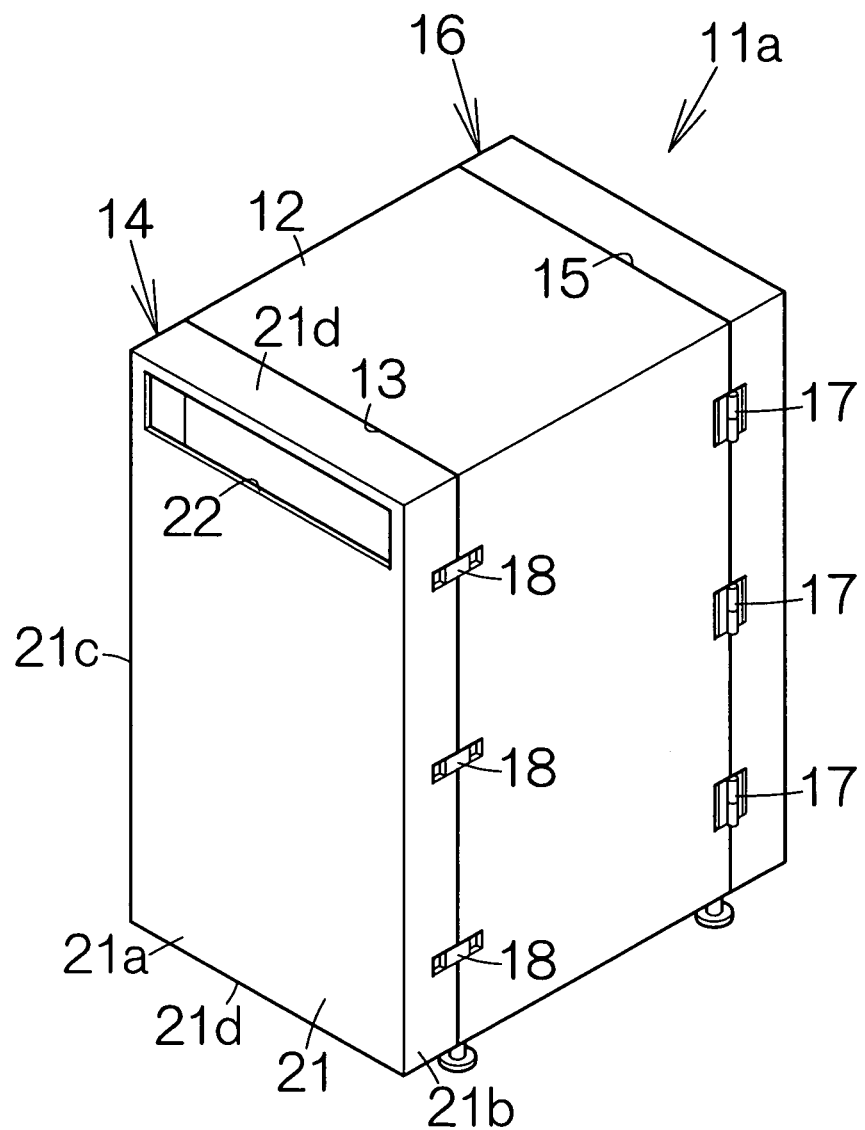
FIG. 13 is a storage box, for an electronic apparatus, according to a second embodiment of the present invention.
Figure 14:
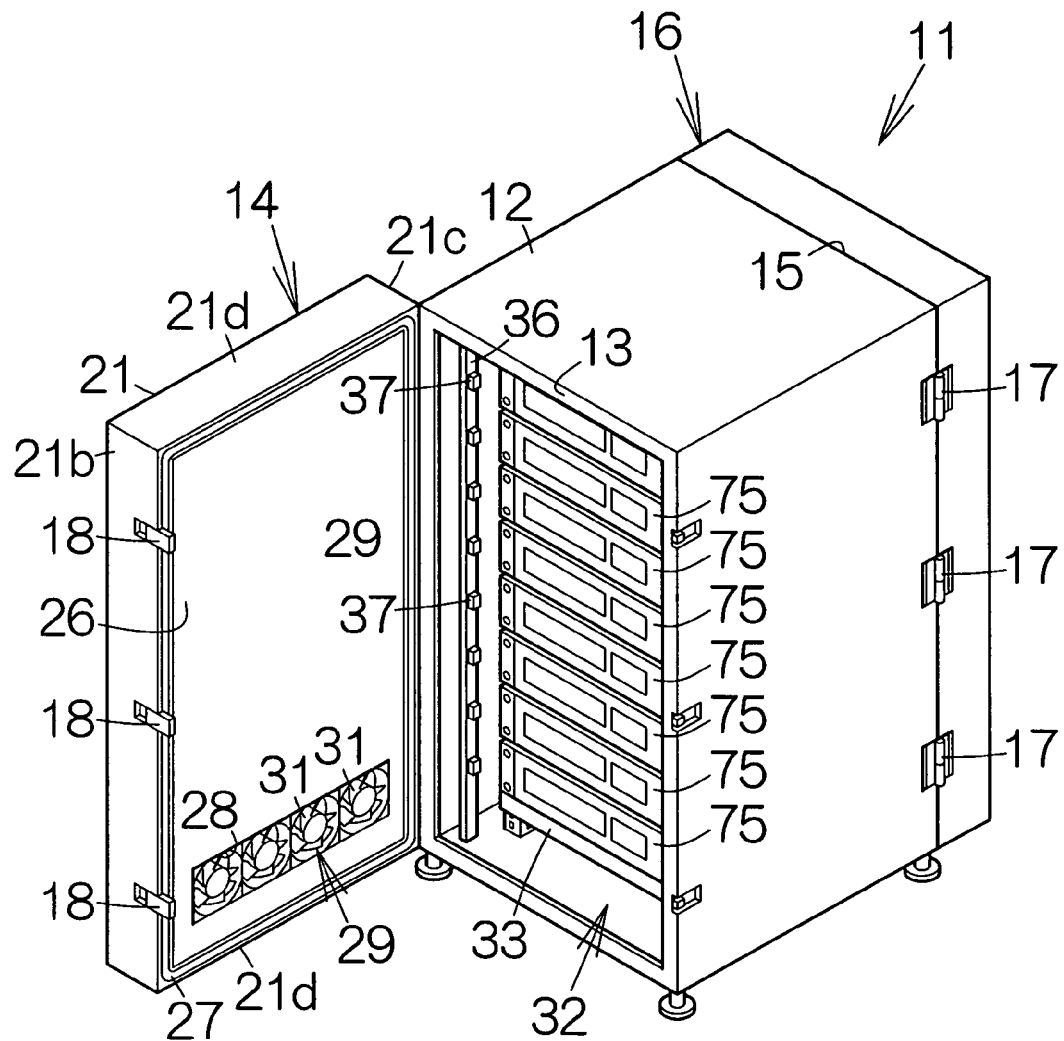
FIG. 14 is a perspective view schematically illustrating the storage box with a first door opened.

FIG. 13 schematically illustrates a storage box 11a, for an electronic apparatus, according to a second embodiment of the present invention. The storage box 11a includes the first door 14 defining the first ventilation opening 22 comprising a window opening elongated in the horizontal direction. The first ventilation opening 22 extends along the edge defined between the first outer wall member 21a and the fourth outer wall member 21d of the upper end. As shown in FIG. 14, the first through opening 28 comprises a window opening elongated in the horizontal direction. The first through opening 28 extends along the edge defined between the first deadening wall member 26 and the fourth outer wall member 21d of the lower end. The first ventilators 31 are arranged in the horizontal direction.

Figure 15:
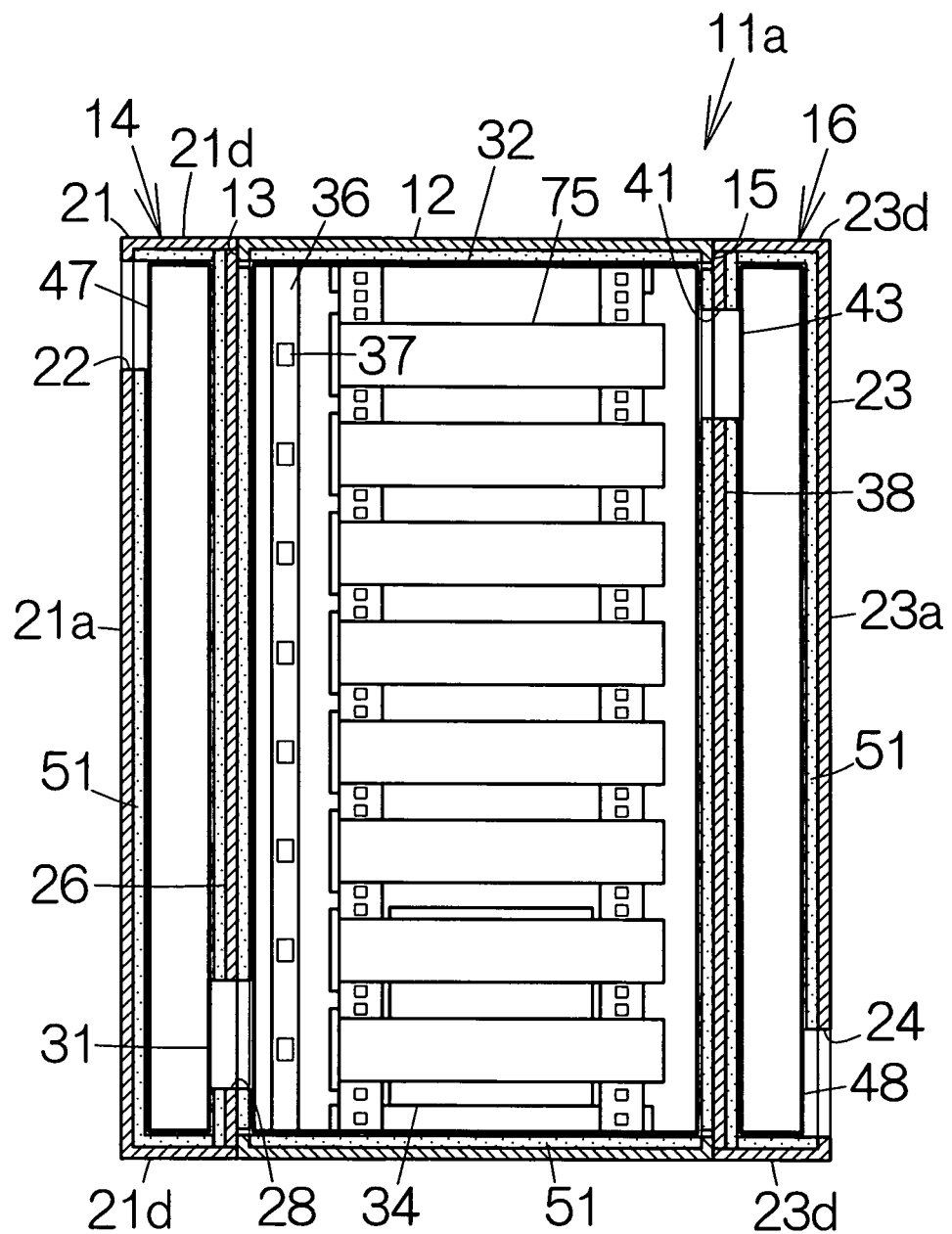
FIG. 15 is a sectional view schematically illustrating the inner structure of the storage box according to the second embodiment of the present invention.

As shown in FIG. 15, the second ventilation opening 24 extends along the edge defined between the first outer wall member 23a and the fourth outer wall member 23d of the lower end. The second through opening 41 is extends along the edge defined between the second deadening wall member 38 and the fourth outer wall member 23d of the upper end. The second ventilation opening 24 and the second through opening 41 are window openings elongated in the horizontal direction. Like reference numerals are attached to the structure or components equivalent to those of the aforementioned storage box 11. The storage box 11a is allowed to enjoy the advantages identical to those obtained in the aforementioned storage box 11. In addition, the first and second auxiliary spaces 47, 48 are set to have a cross-section elongated in the direction of gravity. This results in a further increase in the distance between the first ventilation opening 22 and the first through opening 28 and the distance between the second ventilation opening 24 and the second through opening 41. The transmission of sound is further suppressed.

Figure 16:
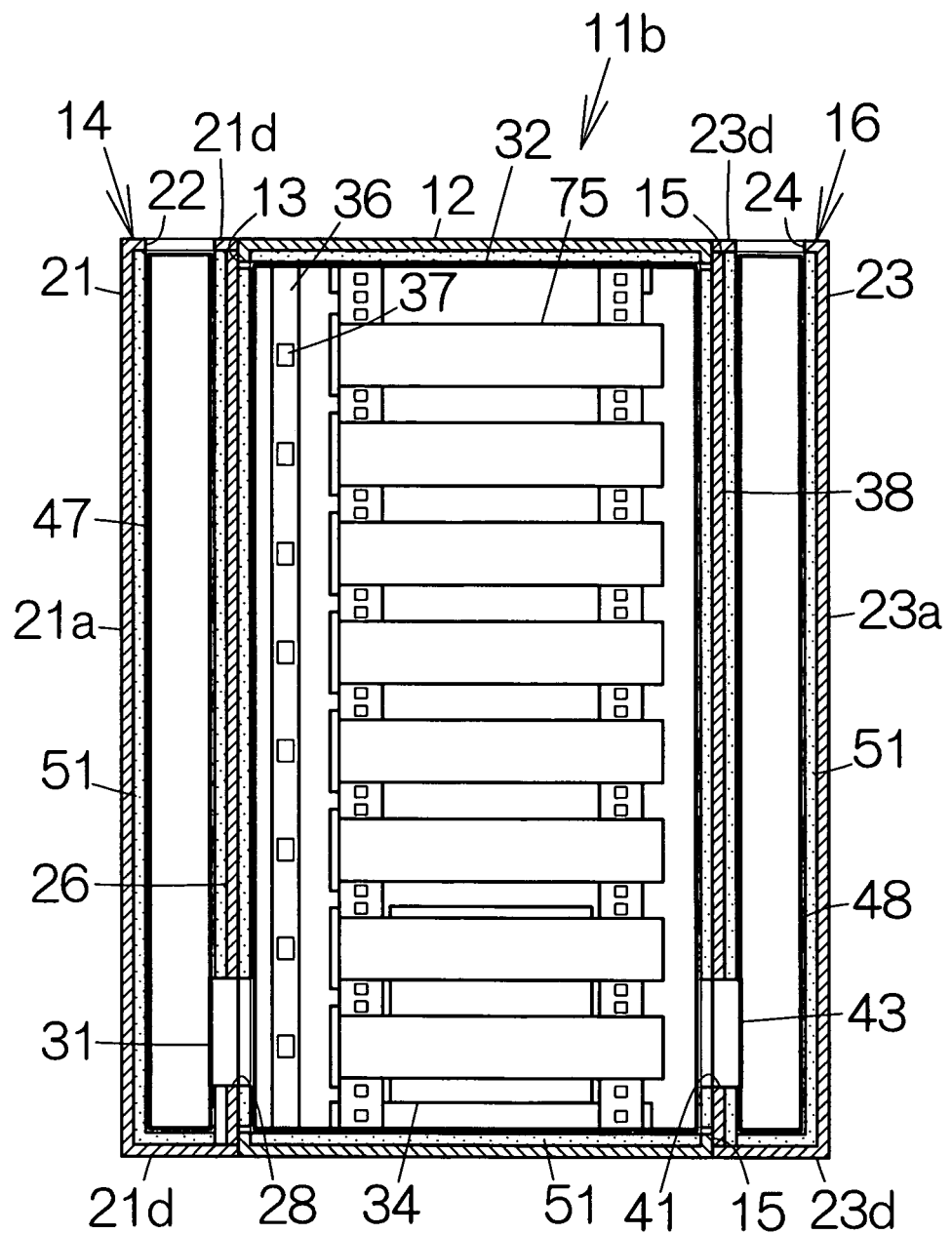
FIG. 16 is a perspective view schematically illustrating a storage box, for an electronic apparatus, according to a third embodiment of the present invention.

FIG. 16 schematically illustrates a storage box 11b, for an electronic apparatus, according to a third embodiment of the present invention. The storage box 11b includes the first door 14 defining the first ventilation opening 22 in the upper one of the fourth outer wall members 21d of the first auxiliary box-shaped enclosure 21. The first ventilation opening 22 is thus formed at the top of the first auxiliary space 47. The first ventilation opening 22 extends along the edge defined between the first outer wall member 21a and the fourth outer wall member 21d of the upper end. The first ventilation opening 22 is a window opening elongated in the horizontal direction in the same manner as described above.

The second ventilation opening 24 is defined at the top of the second auxiliary space 48. The second ventilation opening 24 extends along the edge defined between the first outer wall member 23a and the fourth outer wall member 23d of the upper end. The second through opening 41 extends along the edge defined between the second insulting wall member 38 and the fourth outer wall member 23d of the lower end. The second ventilation opening 24 and the second through opening 41 are window openings elongated in the horizontal direction. Like reference numerals are attached to the structure or components equivalent to those of the aforementioned storage box 11a. The storage box 11b is allowed to enjoy the advantages identical to those obtained in the aforementioned storage box 11. It should be noted that the positions of the first and second ventilation openings 22, 24 are appropriately determined depending on where the storage box 11b is placed.

Figure 17:
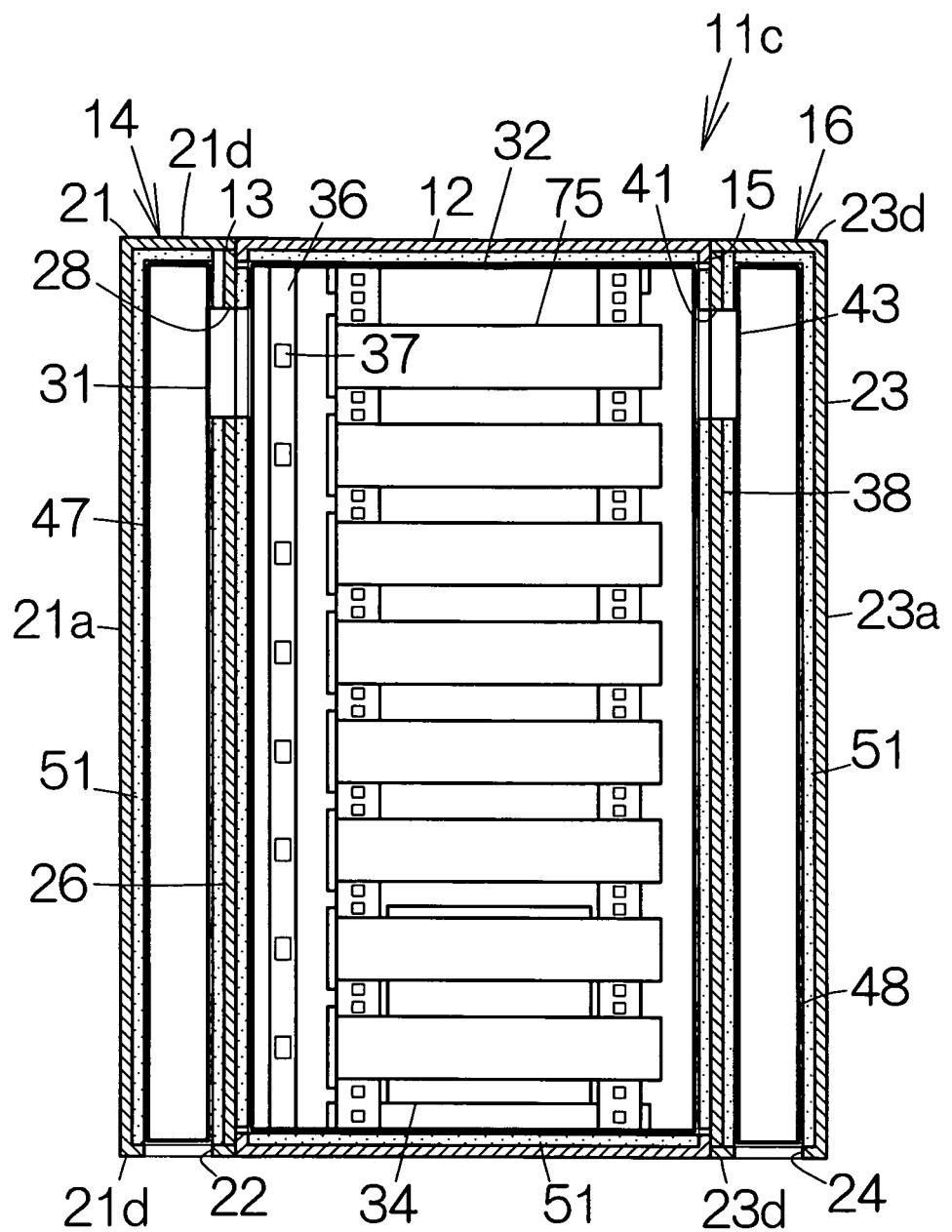
FIG. 17 is a perspective view schematically illustrating a storage box, for an electronic apparatus, according to a fourth embodiment of the present invention.

FIG. 17 schematically illustrates a storage box 11c, for an electronic apparatus, according to a fourth embodiment of the present invention. The storage box 11c includes the first door 14 defining the first ventilation opening 22 in the lower one of the fourth outer wall members 21d of the first auxiliary box-shaped enclosure 21. The first ventilation opening 22 is defined at the bottom of the first auxiliary space 47. The first ventilation opening 22 extends along the edge defined between the first outer wall member 21a and the fourth outer wall member 21d of the lower end. The first ventilation opening 22 is a window opening elongated in the horizontal direction in the same manner as described above.

The second ventilation opening 24 is defined at the bottom of the second auxiliary space 48. The second ventilation opening 24 extends along the edge defined between the first outer wall member 23a and the fourth outer wall member 23d of the lower side. The second through opening 41 extends along the edge defined between the second deadening wall member 38 and the fourth outer wall member 23d of the lower end. The second ventilation opening 24 and the second through opening 41 are window openings elongated in the horizontal direction. Like reference numerals are attached to the structure or components equivalent to those of the aforementioned storage box 11b. The storage box 11c is allowed to enjoy the advantages identical to those obtained in the aforementioned storage box 11.

Figure 18:
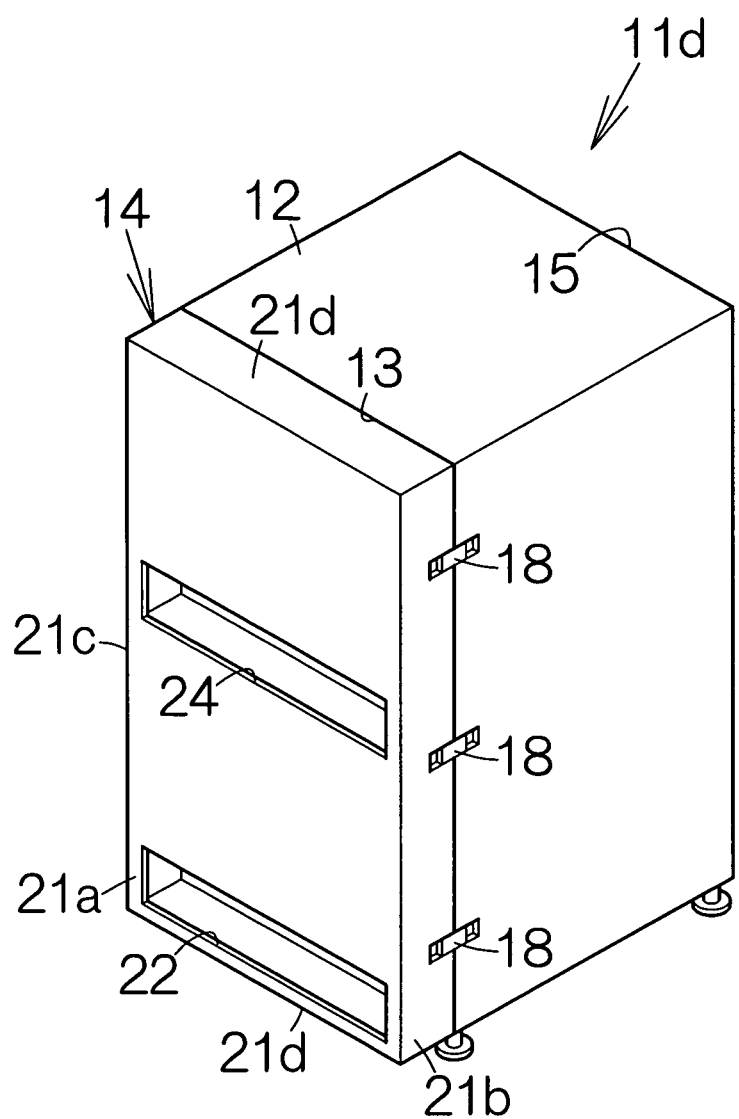
FIG. 18 is a perspective view schematically illustrating a storage box, for an electronic apparatus, according to a fifth embodiment of the present invention.

FIG. 18 schematically illustrates a storage box lid, for an electronic apparatus, according to a fifth embodiment of the present invention. The storage box lid includes the front door 14 closes the front surface 13 of the box-shaped enclosure 12. The second door 16 is omitted. The first and second ventilation openings 22, 24 are formed in the first door 14. The first and second ventilation openings 22, 24 are window openings elongated in the horizontal direction. The first ventilation opening 22 extends along the edge defined between the first outer wall member 21a and the fourth outer wall member 21d of the lower end. The second ventilation opening 24 extends in parallel with the first ventilation opening 22 at a position above the first ventilation opening 22.

Figure 19:
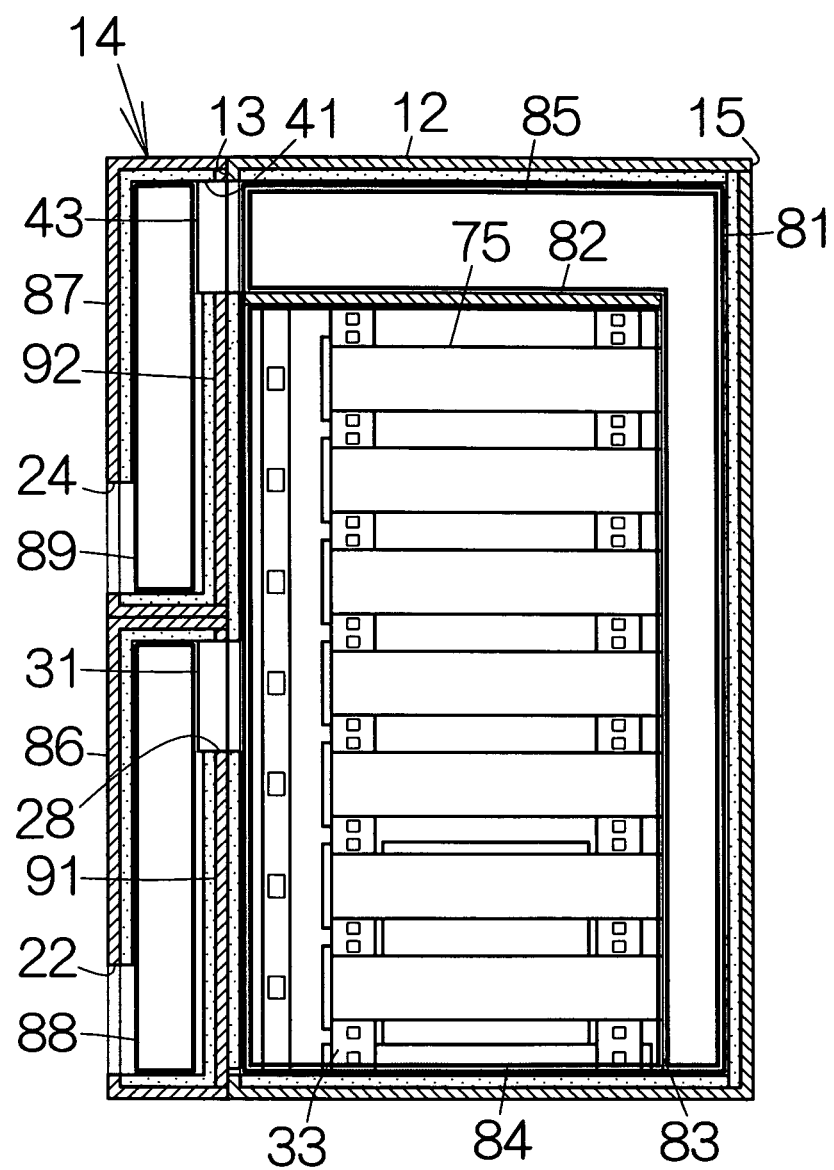
FIG. 19 is a sectional view schematically illustrating the inner structure of the storage box according to the fifth embodiment of the present invention.

As shown in FIG. 19, the box-shaped enclosure 12 defines an inner space 81 between the front surface 13 and the back surface 15. The inner space 81 is open at the front surface 13. The inner space 81 is closed at the back surface 15. A wall member 82 is attached to the box-shaped enclosure 12. The wall member 82 extends along a horizontal plane. A third plane, namely a vertical plane 83, is defined along the rear edge of the wall member 82. A storage space 84 is defined in the inner space 81 between the front surface 13 of the box-shaped enclosure 12 and the vertical plane 83. The storage space 84 is open at the front surface 13 and the vertical plane 83. The rack 33 is placed within the storage space 84. A flow passage 85 is defined in the inner space 81 at a position outside the storage space 84. The flow passage 85 extends from the vertical space 83 to the front space 13.

The first door 14 includes first and second auxiliary box-shaped enclosures 86, 87. The first and second auxiliary box-shaped enclosures 86, 87 define first and second auxiliary spaces 88, 89, respectively. The first ventilation opening 22 is formed on the first auxiliary box-shaped enclosure 86. The first auxiliary box-shaped enclosure 86 is connected to a first deadening wall member 91 extending along the front surface 13 of the box-shaped enclosure 12. The first deadening wall member 91 closes the storage space 84 at the front surface 13 of the box-shaped enclosure 12. The aforementioned first through opening 28 is formed in the first deadening wall member 91. The first through opening 28 is a window opening elongated in the horizontal direction. The first ventilators 31 are mounted in the first through opening 28. The first auxiliary box-shaped enclosure 86 allows placement of the first ventilation opening 28 at the position farthest from the first through opening 28.

The second ventilation opening 24 is formed on the second auxiliary box-shaped enclosure 87. The second auxiliary box-shaped enclosure 87 is connected to a second deadening wall member 92 extending along the front surface 13 of the box-shaped enclosure 12. The second deadening wall member 92 closes the storage space 84 and the flow passage 85 at the front surface 13 of the box-shaped enclosure 12. The aforementioned second through opening 41 is formed in the second deadening wall member 92. The second through opening 41 is elongated in the horizontal direction. The second ventilators 43 are mounted in the second through opening 41. The second auxiliary box-shaped enclosure 87 allows placement of the second ventilation opening 24 at the position farthest from the second through opening 41. The second through opening 41 is connected to the flow passage 85.

A flow passage is thus established based on the first ventilation opening 22, the first auxiliary space 88, the first through opening 28, the storage space 84, the flow passage 85, the second through opening 41, the second auxiliary space 89 and the second ventilation opening 24. Like reference numerals are attached to the structure or components equivalent to those of the aforementioned storage boxes 11-11c. The storage box lid is allowed to enjoy the advantages identical to those obtained in the aforementioned storage boxes 11-11c. In addition, the first and second ventilators 31, 43 are collectively placed on the first door 14. The structure of the storage box 11d can thus be simplified. Likewise, the first and second ventilation openings 22, 24 are collectively placed at the front surface of the first door 14. The storage box 11d can thus be flexibly placed. The deadening wall member may removably be coupled to the box-shaped enclosure 12 for closing the back surface 15 of the box-shaped enclosure 12. Alternatively, the deadening wall member may be coupled to the box-shaped enclosure 12 for opening and closing the back surface 15 of the box-shaped enclosure 12. The server computers 75 may be mounted on or removed from the box-shaped enclosure 12 through the back surface 15.

Figure 20:
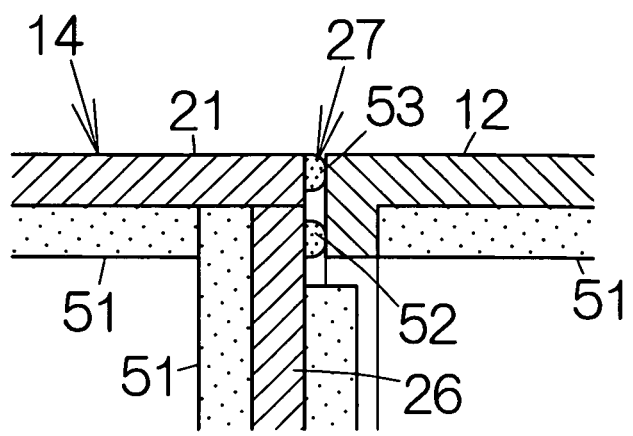
FIG. 20 is an enlarged partial sectional view schematically illustrating packing members according to another specific example.

As shown in FIG. 20, a predetermined interval may be kept between the first elastic packing 52 and the second elastic packing 53. In the case where the width of the first elastic packing 52 and the second elastic packing 53 is set at 10 [mm], for example, the interval may be set at approximately 10 [mm]. The leakage of the sound is thus suppressed with enhanced effectiveness as compared with the case where the first elastic packing 52 and the second elastic packing 53 are adjacent to each other without an interval. The sound insulation of the storage box 11 is improved.

Figure 21:
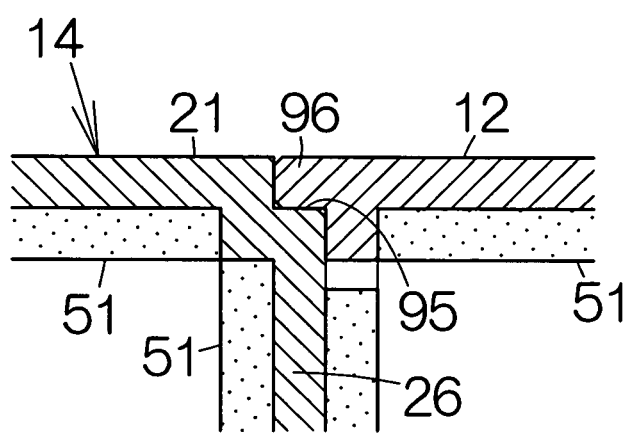
FIG. 21 is an enlarged partial sectional view schematically illustrating a protrusion and a step according to a specific example.

As shown in FIG. 21, a step 95 may be formed to endlessly extend along the outer periphery of each of the first and second doors 14, 16. Protrusions 96 are correspondingly formed to endlessly extend along the outer periphery of the box-shaped enclosure 12. The protrusions 96 are received on the steps 95, respectively. Engagement of the protrusions 96 with the corresponding steps 95 eliminates a gap or gaps between the first door 14 and the box-shaped enclosure 12 and between the second door 16 and the box-shaped enclosure 12 around the storage space 32 over the entire length. No sound leaks from the gap or gaps. The sound of the server computers 75 during the operation is effectively locked in the storage space 32. Alternatively, the step 95 may be formed on the box-shaped enclosure 12. In this case, the protrusion 96 may be formed in each of the first and second doors 14, 16.

Figure 22:
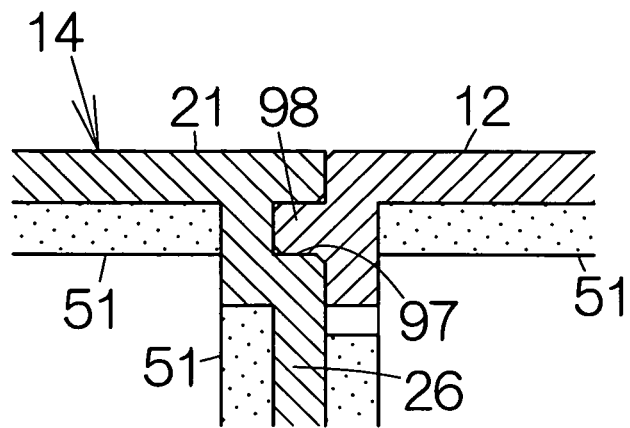
FIG. 22 is an enlarged partial sectional view schematically illustrating a protrusion and a groove according to a specific example.

As shown in FIG. 22, a groove 97 may be formed to endlessly extend along the outer periphery of each of the first and second doors 14, 16. Protrusions 98 are correspondingly formed to endlessly extend along the outer periphery of the box-shaped enclosure 12. The protrusions 98 are received in the grooves 97, respectively. Engagement of the protrusions 98 with the corresponding grooves 97 eliminates a gap or gaps between the first door 14 and the box-shaped enclosure 12 and between the second door 16 and the box-shaped enclosure 12 around the storage space 32 over the entire length. No sound leaks from the gap or gaps. Sound of the server computers 75 during the operation is effectively locked in the storage space 32.

Figure 23:
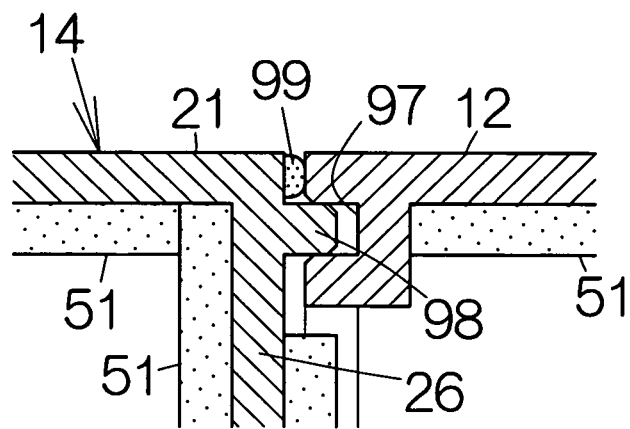
FIG. 23 is an enlarged partial sectional view schematically illustrating a protrusion and a groove according to another specific example.

As shown in FIG. 23, the grooves 97 may be formed on the box-shaped enclosure 12. In this case, the protrusion 98 may correspondingly be formed in each of the first and second doors 14, 16. An elastic packing 99 may be attached to the outer periphery of each of the first and second doors 14, 16 to endlessly extend along the outer periphery of the first or second door 14, 16. The elastic packing 99 may be placed outside the groove 97 or the protrusion 98, for example. This structure enables elimination of a gap or gaps between the first door 14 and the box-shaped enclosure 12 and between the second door 16 and the box-shaped enclosure 12 around the storage space 32 over the entire length. No sound leaks from the gap or gaps. Sound of the server computers 75 during the operation is effectively locked in the storage space 32.

Figure 24:
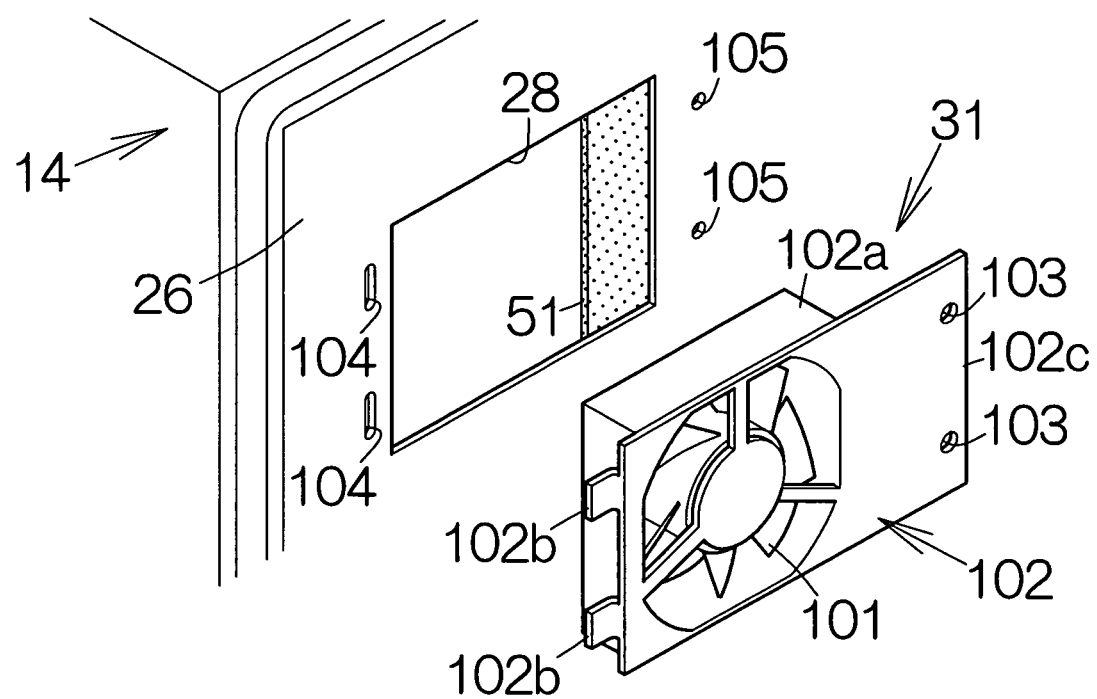
FIG. 24 is an enlarged partial perspective view schematically illustrating the structure of a ventilator for attachment.

As shown in FIG. 24, the first ventilators 31 are removed from the first through opening 28 for replacement, for example. The individual first ventilators 31 include a cover 102 to enclose a rotor 101. The cover 102 includes a cover body 102a. A pair of hooks 102b is formed integral with the cover body 102a. The hooks 102b are placed on one of the side edges of the cover body 102a at a predetermined interval, for example. The hooks 102b are bent to protrude from the cover body 102a. A flat plate 102c is formed integral with the other edge of the cover body 102a. A wiring and a connector are attached to the back surface of the flat plate 102c. A pair of through bores 103 is formed in the flat plate 102c, for example.

A pair of elongated bores 104 is formed in the first deadening wall member 26 at a position adjacent to one of the side edges of the first through opening 28. The elongated bores 104 are spaced at a predetermined interval corresponding to the interval between the hooks 102b. A pair of screw bores 105 is formed in the first deadening wall member 26 at a position adjacent to the other side edge of the first through opening 28. The position of the screw bores 105 corresponds to that of the aforementioned through bores 103. The acoustic material 51 is placed over a part of the first through opening 28. The structure of the second ventilators 43 may be identical to that of the first ventilators 31.

The hooks 102b are inserted into the corresponding elongated bores 104 for the attachment of the individual ventilators 31. The front surfaces of the hooks 102b contact the back surface of the first deadening wall member 26. The cover body 102a is received in the first through opening 28. The through bores 103 of the flat plate 102c are aligned with the corresponding screw bores 105 of the first deadening wall member 26, respectively. A screw, now shown, is screwed into the individual screw bore 105 through the through bore 103. The first ventilator 31 is in this manner mounted in the first through opening 28. The back surface of the flat plate 102c is received on the acoustic material 51. The acoustic material 51 serves to eliminate flutter of the wiring on the back surface of the flat plate 102c.

What is claimed is:

1. A storage box for an electronic apparatus, comprising:
    a box-shaped enclosure including a deadening wall or walls defining a storage space between first and second planes, the storage space being open at the first and second planes and having a dimension enough to arrange electronic apparatuses in a vertical direction;
    a deadening wall member supported on the box-shaped enclosure, the deadening wall member extending along the first plane;
    an auxiliary box-shaped enclosure connected to the box-shaped enclosure so as to close the first plane of the box-shaped enclosure, the auxiliary box-shaped enclosure defining an auxiliary space isolated from the storage space with the deadening wall member;
    a through opening formed in the deadening wall member so as to spatially connect the storage space to the auxiliary space, the through opening having more length in the vertical direction than width in a horizontal direction and the length in the vertical direction being enough to face at least two of the electronic apparatuses; and
    a ventilation opening formed on the auxiliary box-shaped enclosure at a position facing the deadening wall member, the ventilation opening having more length in the vertical direction than width in the horizontal direction and the length in the vertical direction being enough to face the at least two of the electronic apparatuses.

2. The storage box according to claim 1, wherein the ventilation opening is formed in a wall of the auxiliary box-shaped enclosure in parallel with the deadening wall member.

3. The storage box according to claim 1, wherein the auxiliary box-shaped enclosure includes side wall members located at opposite sides of the auxiliary space, the through opening being elongated along one of the side wall members, the ventilation opening being elongated along other of the side wall members.

4. The storage box according to claim 1, wherein a distance is set equal to or larger than 0.4 meters between the through opening and the ventilation opening.

5. A storage box for an electronic apparatus, comprising:
    a box-shaped enclosure including a deadening wall or walls defining a storage space between first and second planes, the storage space being open at the first and second planes and having a dimension enough to arrange electronic apparatuses in a vertical direction;
    a deadening wall member supported on the box-shaped enclosure, the deadening wall member extending along the first plane;
    an auxiliary box-shaped enclosure connected to the box-shaped enclosure so as to close the first plane of the box-shaped enclosure, the auxiliary box-shaped enclosure including a deadening wall or walls defining an auxiliary space isolated from the storage space with the deadening wall member;
    a through opening formed in the deadening wall member so as to spatially connect the storage space to the auxiliary space, the through opening having more length in the vertical direction than width in a horizontal direction and the length in the vertical direction being enough to face at least two of the electronic apparatuses; and
    a ventilation opening formed on the auxiliary box-shaped enclosure at a position facing the deadening wall member, the ventilation opening having more length in the vertical direction than width in the horizontal direction and the length in the vertical direction being enough to face the at least two of the electronic apparatuses.

6. The storage box according to claim 5, wherein the ventilation opening is formed in a wall of the auxiliary box-shaped enclosure in parallel with the deadening wall member.

7. The storage box according to claim 5, wherein the auxiliary box-shaped enclosure includes side wall members located at opposite sides of the auxiliary space, the through opening being elongated along one of the side wall members, the ventilation opening being elongated along other of the side wall members.

8. The storage box according to claim 5, wherein a distance is set equal to or larger than 0.4 meters between the through opening and the ventilation opening.

9. A storage box for an electronic apparatus, comprising:
    a box-shaped enclosure including a deadening wall or walls defining a storage space between first and second planes, the storage space being open at the first and second planes and having a dimension enough to arrange electronic apparatuses in a vertical direction;
    a deadening wall member supported on the box-shaped enclosure, the deadening wall member extending along the first plane;
    an auxiliary box-shaped enclosure connected to the box-shaped enclosure so as to close the first plane of the box-shaped enclosure, the auxiliary box-shaped enclosure defining an auxiliary space isolated from the storage space with the deadening wall member;
    a through opening formed in the deadening wall member so as to spatially connect the storage space to the auxiliary space, the through opening having more length in the vertical direction than width in a horizontal direction and the length in the vertical direction being enough to face at least two of the electronic apparatuses;
    a ventilating unit mounted in the through opening, the ventilating unit including ventilators arranged in a row in the vertical direction; and
    a ventilation opening formed on the auxiliary box-shaped enclosure at a position facing the deadening wall member, the ventilation opening having more length in the vertical direction than width in the horizontal direction and the length in the vertical direction being enough to face the at least two of the electronic apparatuses.

10. The storage box according to claim 9, wherein the ventilators are individually removable from the deadening wall member.

11. The storage box according to claim 9, further comprising:
   a second deadening wall member supported on the box-shaped enclosure, the second deadening wall member extending along the second plane;
   a second auxiliary box-shaped enclosure connected to the box-shaped enclosure so as to close the second plane of the box-shaped enclosure, the second auxiliary box-shaped enclosure defining a second auxiliary space isolated from the storage space with the second deadening wall member;
   a second through opening formed in the second deadening wall member so as to spatially connect the storage space to the second auxiliary space, the second through opening having more length in the vertical direction;
   a second ventilating unit mounted in the second through opening, the second ventilating unit including second ventilators arranged in a row in the vertical direction; and
   a second ventilation opening formed on the second auxiliary box-shaped enclosure at a position facing the second deadening wall member, the second ventilation opening having more length in the vertical direction than width in the horizontal direction.

12. The storage box according to claim 11, wherein a group of the second ventilators is identical to a group of the ventilators.

13. A storage box for an electronic apparatus, comprising:
   a box-shaped enclosure including a deadening wall or walls defining a storage space between first and second planes, the storage space being open at the first and second planes;
   a rack placed within the storage space, the rack defining a rack space to enclose electronic apparatuses arranged in a vertical direction;
   a deadening wall member supported on the box-shaped enclosure, the deadening wall member extending along the first plane;
   an auxiliary box-shaped enclosure connected to the box-shaped enclosure so as to close the first plane of the box-shaped enclosure, the auxiliary box-shaped enclosure defining an auxiliary space isolated from the storage space with the deadening wall member;
   a through opening formed in the deadening wall member so as to spatially connect the storage space to the auxiliary space, the through opening having more length in the vertical direction than width in a horizontal direction and the length in the vertical direction being enough to face at least two of the electronic apparatuses; and
   a ventilating unit mounted in the through opening, the ventilating unit including ventilators arranged in a row in the vertical direction;
   a ventilation opening formed on the auxiliary box-shaped enclosure at a position facing the deadening wall member, the ventilation opening having more length in the vertical direction than width in the horizontal direction and the length in the vertical direction being enough to face the at least two of the electronic apparatuses;
   at least one thermal sensor placed in a space between the deadening wall member and the rack space; and
   a controller circuit connected to the thermal sensor, the controller circuit designed to control operation of the ventilating unit based on a temperature detected at the thermal sensor.

14. The storage box according to claim 13, wherein the thermal sensor is placed outside the rack space at a position distanced from the deadening wall member.

15. The storage box according to claim 14, wherein the auxiliary box-shaped enclosure includes:
   a first outer wall extending in parallel with the deadening wall member; and
   second and third outer walls opposed to each other, the second and third walls connecting the deadening wall member to the first outer wall, wherein
   the through opening extends along an edge defined between the deadening wall member and the second outer wall, and
   the thermal sensor is arranged along an edge defined between the deadening wall member and the third outer wall.

16. A storage box for an electronic apparatus, comprising:
   a box-shaped enclosure including a deadening wall or walls defining a storage space between first and second planes, the storage space being open at the first and second planes and having a dimension enough to arrange electronic apparatuses in a vertical direction;
   an auxiliary box-shaped enclosure connected to the box-shaped enclosure so as to close the first plane of the box-shaped enclosure, the auxiliary box-shaped enclosure including a wall member and an outer wall in cooperation defining an auxiliary space isolated from the storage space with the wall member;
   a through opening formed in the wall member of the auxiliary box-shaped enclosure so as to spatially connect the storage space to the auxiliary space, the through opening having more length in the vertical direction than width in a horizontal direction and the length in the vertical direction being enough to face at least two of the electronic apparatuses; and
   a ventilation opening formed in the outer wall of the auxiliary box-shaped enclosure at a position facing the outer wall, the ventilation opening having more length in the vertical direction than width in the horizontal direction and the length in the vertical direction being enough to face the at least two of the electronic apparatuses, wherein
   the auxiliary space extends from the through opening to the ventilation opening, the auxiliary space bending between the through opening and the ventilation opening.

17. The storage box according to claim 16, wherein the outer wall of the auxiliary box-shaped enclosure includes:
   a first outer wall member extending in parallel with the wall member; and
   second and third outer wall members opposed to each other, the second and third outer wall members connecting the wall member to the first outer wall member, wherein
   the through opening extends along an edge defined between the wall member and the second outer wall member, and
   the ventilation opening extends along an edge defined between the first outer wall member and the third outer wall member.

* * * * *